US012666936B2

(12) United States Patent
Jung et al.

(10) Patent No.: US 12,666,936 B2
(45) Date of Patent: Jun. 23, 2026

(54) INTEGRATED CIRCUIT DEVICE INCLUDING GATE CONTACT

(71) Applicant: SAMSUNG ELECTRONICS CO., LTD., Suwon-si (KR)

(72) Inventors: Yoonyoung Jung, Suwon-si (KR); Deokhan Bae, Suwon-si (KR); Juhun Park, Seoul (KR); Yuri Lee, Hwaseong-si (KR); Sooyeon Hong, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 503 days.

(21) Appl. No.: 18/077,281

(22) Filed: Dec. 8, 2022

(65) Prior Publication Data

US 2023/0187358 A1      Jun. 15, 2023

(30) Foreign Application Priority Data

Dec. 15, 2021    (KR) ......................... 10-2021-0179573

(51) Int. Cl.
*H10W 20/20*        (2026.01)
*H10D 30/43*        (2025.01)
           (Continued)

(52) U.S. Cl.
CPC ............ *H10W 20/20* (2026.01); *H10D 30/43* (2025.01); *H10D 30/6211* (2025.01);
           (Continued)

(58) Field of Classification Search
CPC .............. H01L 23/535; H10D 30/6211; H10D 84/0186; H10D 62/121; H10D 64/017;
           (Continued)

(56) References Cited

U.S. PATENT DOCUMENTS

| | | | |
|---|---|---|---|
| 9,735,242 B2 | 8/2017 | Xie et al. | |
| 10,204,994 B2 | 2/2019 | Xie et al. | |
| 10,283,408 B2 | 5/2019 | Xie et al. | |
| 10,388,747 B1 | 8/2019 | Xie et al. | |
| 2016/0027703 A1* | 1/2016 | Do ......................... | H10D 89/10 |
| | | | 438/587 |

(Continued)

FOREIGN PATENT DOCUMENTS

| | | |
|---|---|---|
| KR | 10-2021-0033096 A | 3/2021 |
| KR | 10-2021-0054753 A | 5/2021 |

OTHER PUBLICATIONS

Office Action dated Sep. 29, 2025 issued in corresponding to Korean Patent Application No. 10-2021-0179573.

*Primary Examiner* — Christine A Enad
(74) *Attorney, Agent, or Firm* — Morgan, Lewis & Bockius LLP

(57)        ABSTRACT

An integrated circuit device includes: a substrate including a device area and a field area; active regions extending in a first direction in the device area; a first gate structure extending in a second direction intersecting the first direction in the device area and the field area; a second gate structure spaced apart from the first gate structure in the first direction; a first gate contact disposed on the first gate structure in the device area; and a second gate contact disposed on the second gate structure in the field area, wherein the first gate contact and the second gate contact are disposed at a level lower than an upper end of the first gate structure, and wherein a first minimum width of the first gate contact and a second minimum width of the second gate contact are different from each other.

14 Claims, 28 Drawing Sheets

(51) Int. Cl.

| | |
|---|---|
| *H10D 30/62* | (2025.01) |
| *H10D 30/67* | (2025.01) |
| *H10D 62/10* | (2025.01) |
| *H10D 64/01* | (2025.01) |
| *H10D 84/01* | (2026.01) |
| *H10D 84/03* | (2025.01) |
| *H10D 84/85* | (2025.01) |
| *H10W 20/41* | (2026.01) |

(52) U.S. Cl.
CPC ..... *H10D 30/6219* (2025.01); *H10D 30/6729* (2025.01); *H10D 30/6735* (2025.01); *H10D 62/121* (2025.01); *H10D 64/017* (2025.01); *H10D 84/017* (2025.01); *H10D 84/0186* (2025.01); *H10D 84/0193* (2025.01); *H10D 84/038* (2025.01); *H10D 84/853* (2025.01); *H10W 20/435* (2026.01)

(58) Field of Classification Search
CPC ............ H10D 84/853; H10D 30/6735; H10D 84/017; H10D 30/43; H10D 30/6219; H10D 84/038; H10D 30/6729; H10D 84/0193

See application file for complete search history.

(56) References Cited

U.S. PATENT DOCUMENTS

| | | | |
|---|---|---|---|
| 2017/0221891 A1* | 8/2017 | Chen ..................... | H10D 30/024 |
| 2020/0027992 A1* | 1/2020 | Jung ................... | H10D 30/6757 |
| 2021/0127749 A1 | 5/2021 | Liu et al. | |
| 2021/0231727 A1 | 7/2021 | Park et al. | |
| 2021/0242349 A1 | 8/2021 | Jung et al. | |
| 2022/0093757 A1* | 3/2022 | Huang ................. | H10D 64/021 |
| 2022/0254927 A1* | 8/2022 | Cheng .............. | H01L 21/76897 |

* cited by examiner

FIG. 9B

INTEGRATED CIRCUIT DEVICE INCLUDING GATE CONTACT

CROSS-REFERENCE TO THE RELATED APPLICATION

This application claims priority under 35 U.S.C. 119(a) to Korean Patent Application No. 10-2021-0179573, filed on Dec. 15, 2021, in the Korean Intellectual Property Office, the disclosure of which is incorporated by reference herein in its entirety.

TECHNICAL FIELD

The exemplary embodiments of the present inventive concept relate to an integrated circuit device including a gate contact.

DISCUSSION OF THE RELATED ART

In accordance with fineness of elements, high integration of an integrated circuit device is under development, and demand for a reduction in area of the integrated circuit device is increasing. Accordingly, technology capable of not only providing an insulating distance between contacts, vias and wirings while reducing areas occupied by the contacts, vias and wirings, but also capable of increasing reliability of the integrated circuit device is under development and is desirable.

SUMMARY

According to an exemplary embodiment of the present inventive concept, an integrated circuit device includes: a substrate including a device area and a field area; active regions extending in a first direction in the device area; a first gate structure extending in a second direction intersecting the first direction in the device area and the field area; a second gate structure spaced apart from the first gate structure in the first direction; a first gate contact disposed on the first gate structure in the device area; and a second gate contact disposed on the second gate structure in the field area, wherein the first gate contact and the second gate contact are disposed at a level lower than an upper end of the first gate structure, and wherein a first minimum width of the first gate contact and a second minimum width of the second gate contact are different from each other.

According to an exemplary embodiment of the present inventive concept, an integrated circuit device includes: a substrate including a device area and a field area; active regions extending in a first direction in the device area; a first gate electrode extending in a second direction intersecting the first direction in the device area and the field area; a first gate capping; layer disposed on the first gate electrode; a second gate electrode spaced apart from the first gate electrode in the first direction; a second gate capping layer disposed on the second gate electrode; a first gate contact overlapping the first gate electrode while extending through the first gate capping layer in the device area; and a second gate contact overlapping the second gate electrode while extending through the second gate capping layer in the field area, wherein a first minimum width of the first gate contact and a second minimum width of the second gate contact are different from each other.

According to an exemplary embodiment of the present inventive concept, an integrated circuit device includes: a substrate including a device area and a field area; active regions extending in a first direction in the device area; a first gate electrode extending in a second direction intersecting the first direction in the device area and the field area; a first gate capping layer disposed on the first gate electrode; a second gate electrode spaced apart from the first gate electrode in the first direction; a second gate capping layer disposed on the second gate electrode; a first gate contact connected to the first gate electrode and penetrating the first gate capping layer in the device area; a second gate contact connected to the second gate electrode and penetrating the second gate capping layer in the field area; a source/drain region disposed on the active regions; and a source/drain contact disposed on the source/drain region, wherein a first minimum width of the first gate contact is greater than a second minimum width of the second gate contact.

BRIEF DESCRIPTION OF THE DRAWINGS

FIGS. 4A, 4B, 5A, 5B, 6A, 6B, 7A, 7B, 8A, 8B, 9A, 9B, 10A, 10B, 11A, 11B, 12A, 12B, 13A, 13B, 14A, and 14B are cross-sectional views shown in accordance with a process sequence to illustrate a method for manufacturing an integrated circuit device in accordance with an exemplary embodiment of the present inventive concept.

DETAILED DESCRIPTION OF THE EMBODIMENTS

Figure 1:
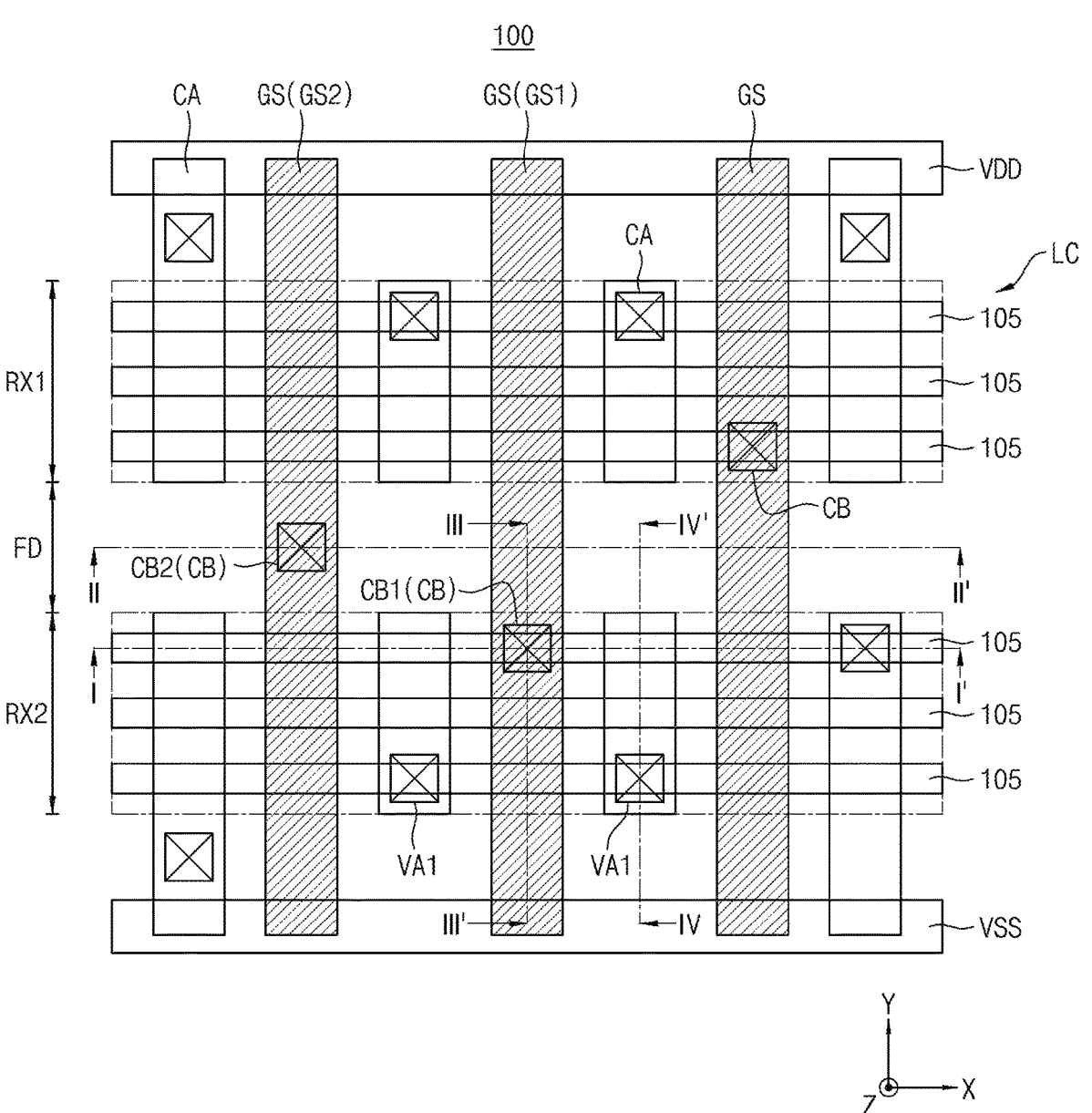
FIG. 1 is a planar layout illustrating an integrated circuit device according to an exemplary embodiment of the present inventive concept.
Figure 2A:
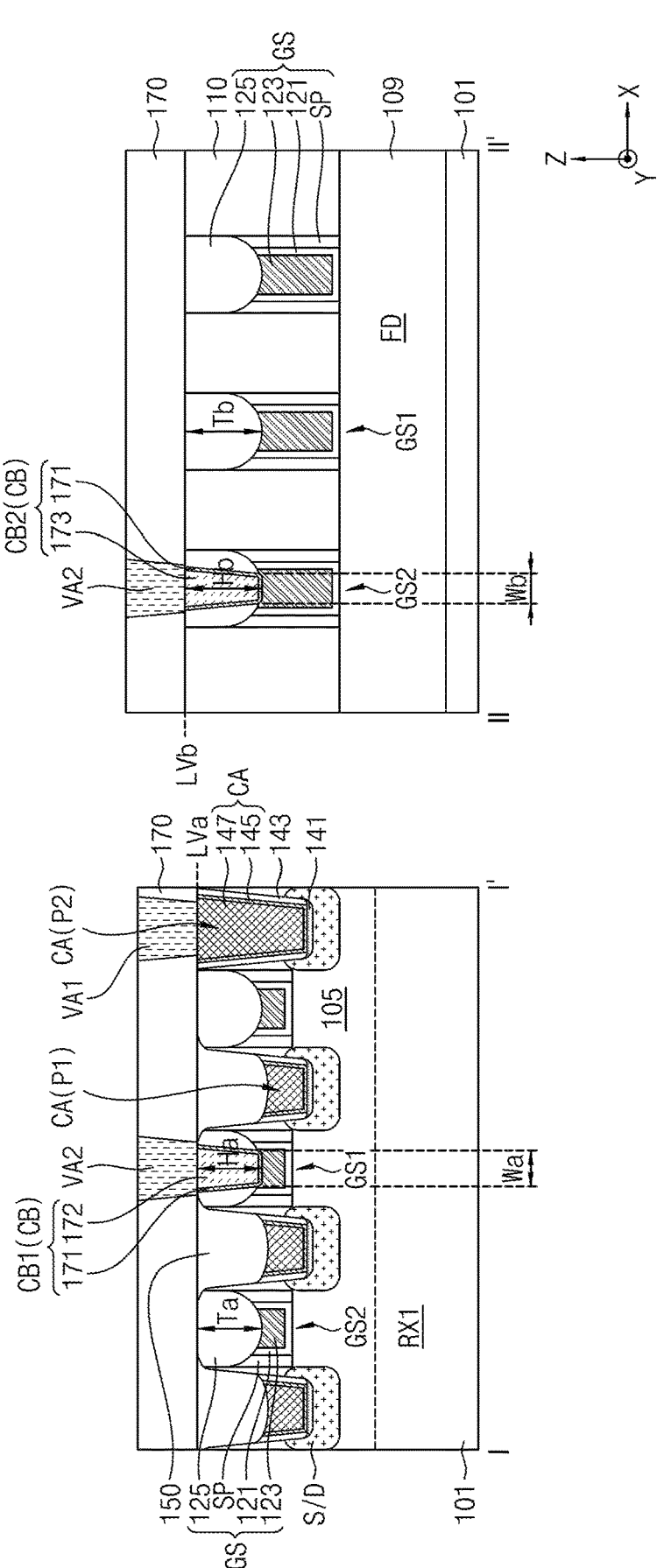
FIG. 2A is cross-sectional views taken along lines I-I' and II-II' in FIG. 1.
Figure 2B:
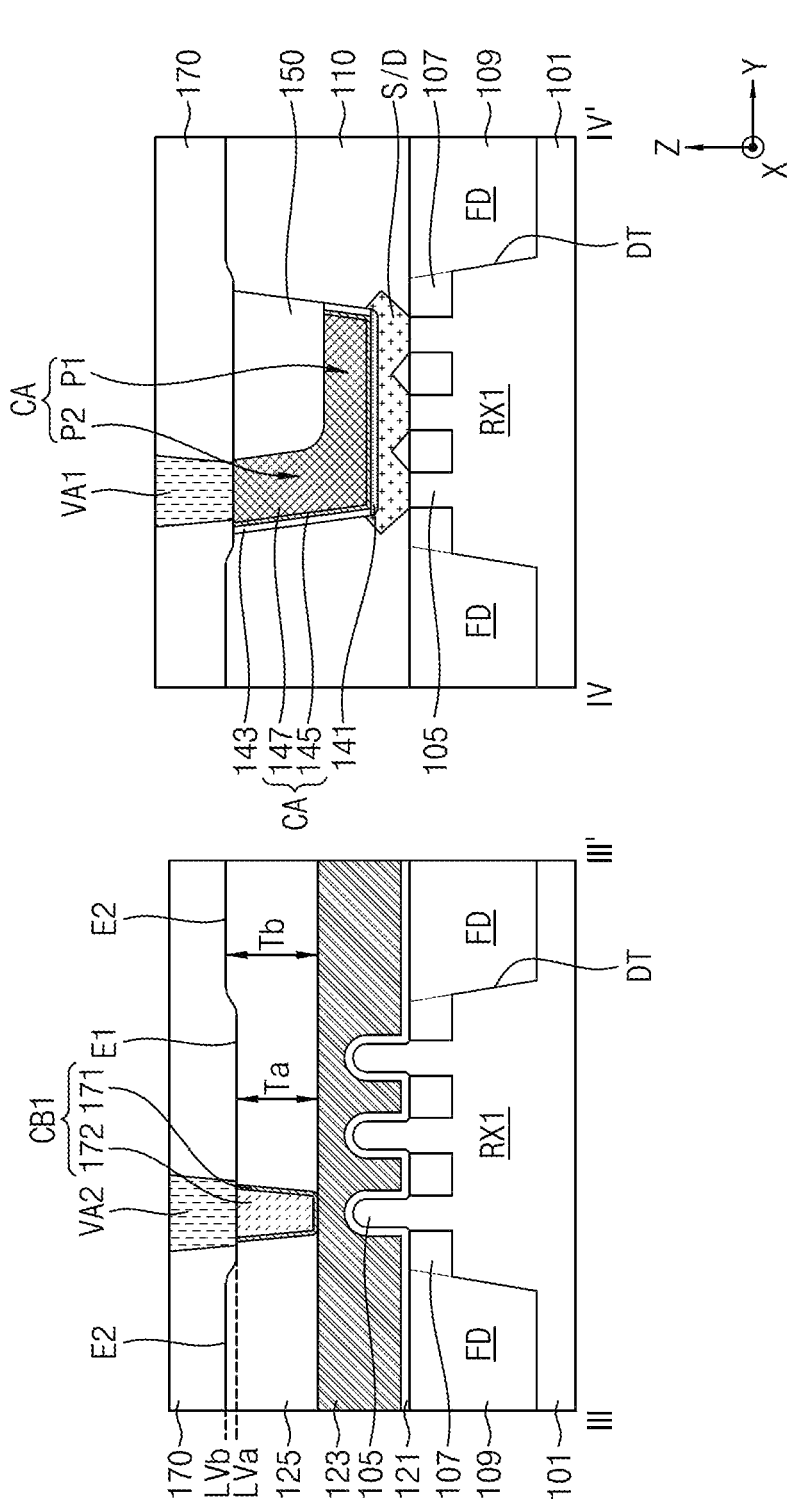
FIG. 2B is cross-sectional views taken along lines III-III' and IV-IV' in FIG. 1.

FIG. 1 is a planar layout illustrating an integrated circuit device according to an exemplary embodiment of the present inventive concept. FIG. 2A illustrate cross-sectional views taken along lines I-I' and II-II' in FIG. 1. FIG. 2B illustrate cross-sectional views taken along lines III-III' and IV-IV' in FIG. 1.

Referring to FIGS. 1, 2A and 2B, an integrated circuit device 100 may constitute a logic cell including transistors. For example, the transistor may be a fin field effect transistor (FinFET). The integrated circuit device 100 may include a logic cell LC formed on a substrate 101.

The integrated circuit device 100 may include the substrate 101. The substrate 101 may have the form of a plate extending in a first direction (e.g., an X direction) and a second direction (e.g., a Y direction), and may include a portion protruding in a third direction (e.g., a Z direction). For example, the first direction (e.g., the X direction) and the second direction (e.g., the Y direction) may perpendicularly intersect each other in the same plane. For example, the third direction (e.g., the Z direction) may perpendicularly intersect the first direction (e.g., the X direction) and the second direction (e.g., the Y direction). The substrate 101 may include a semiconductor such as Si or Ge, or may include a compound semiconductor such as SiGe, SiC, GaAs, InAs, or InP. The substrate 101 may include a conductive region and, for example, may include a well doped with an impurity or a structure doped with an impurity.

The logic cell LC may include a first device area RX1 and a second device area RX2. The first device area RX1 and the second device area RX2 may be spaced apart from each other in the second direction (e.g., the Y direction), and a field area FD is interposed therebetween. Active regions 105 may be formed in the first device area RX1 and the second device area RX2. The active regions 105 may be fin-type active regions protruding from the substrate 101. The active regions 105 may extend in the first direction (e.g., the X direction), and may be spaced apart from one another in the second direction (e.g., the Y direction).

A first element isolation layer 107 may cover lower portions of the active regions 105. The active regions 105 may protrude upwards beyond an upper surface of the first element isolation layer 107. A second element isolation layer 109 may be disposed in the field area FD on the substrate 101. A deep trench DT, which is formed by the substrate 101 and the first element isolation layer 107, may be formed in the field area FD, and the second element isolation layer 109 may fill the deep trench DT. The second element isolation layer 109 may divide the first device area RX1 and the second device area RX2 from each other. For example, each of the first element isolation layer 107 and the second element isolation layer 109 may include oxide.

Gate structures GS may extend in the second direction (e.g., the Y direction) while intersecting the active regions 105. The gate structures GS may be formed to intersect each of the first device area RX1, the field area FD and the second device area RX2. The gate structures GS may be disposed on the first element isolation layer 107 and the second element isolation layer 109, and may cover a part of an upper portion of the active region 105 protruding from the first element isolation layer 107. The gate structures GS may have the same width in the first direction (e.g., the X direction), and may be arranged at a uniform pitch in the first direction (e.g., the X direction).

Transistors may be formed along the gate structures GS in each of the first device area RX1 and the second device area RX2. Each of the transistors may be, for example, a MOS transistor having a three-dimensional structure in which a channel is formed over the fin-type active regions 105. In an exemplary embodiment of the present inventive concept, the first device area RX1 may be an NMOS transistor area, and the second device area RX2 may be a PMOS transistor area.

Each of the gate structures GS may include a gate electrode 123, gate spacers SP, a gate insulating layer 121, and a gate capping layer 125. The gate electrode 123 may have a structure in which a metal nitride layer, a metal layer, a conductive capping layer, and a gap-fill metal layer are sequentially stacked on each other. For example, the metal nitride layer and the metal layer may include at least one of Ti, Ta, W, Ru, Nb, Mo, and/or Hf. For example, the gap-fill metal layer may include W or Al. The gate electrode 123 may include a work function metal containing layer. The work function metal containing layer may include at least one of, for example, Ti, W, Ru, Nb, Mo, Hf, Ni, Co, Pt, Yb, Tb, Dy, Er, and/or Pd.

The gate spacers SP may be disposed on opposite side-walls of the gate electrode 123. The gate spacers SP may include, for example, SiN, SiOCN, SiCN, or a combination thereof, without being limited thereto. For example, each of the gate spacers SP may be constituted by multiple layers; however, the present inventive concept is not limited thereto.

The gate insulating layer 121 may be interposed between the gate electrode 123 and the gate spacer SP, between the gate electrode 123 and the active regions 105, between the gate electrode 123 and the first element isolation layer 107, and between the gate electrode 123 and the second element isolation layer 109. The gate insulating layer 121 may extend along a profile of the active region 105, which protrudes upwards from the first element isolation layer 107. The gate insulating layer 121 may include, for example, silicon oxide, high-k dielectrics, or a combination thereof. The high-k dielectrics may include at least one of, for example, metal oxide and/or metal oxynitride.

In an exemplary embodiment of the present inventive concept, the transistors formed along the gate structures GS in each of the first device area RX1 and the second device area RX2 may include a negative capacitance (NC) FET using a negative capacitor. In this case, for example, the gate insulating layer 121 may include a ferroelectric material film, which has ferroelectric characteristics, and a paraelec-tric material film having paraelectric characteristics.

The ferroelectric material film may have a negative capacitance, whereas the paraelectric material film may have a positive capacitance. For example, when two or more capacitors are connected in series and the capacitance of each of the capacitors has a positive value, the total capaci-tance of the capacitors may be lower than the capacitance of each individual capacitor. In addition, when the capacitance of at least one of the two or more capacitors connected in series has a negative value, the total capacitance of the capacitors may have a positive value, and the total capaci-tance may be greater than an absolute value of each indi-vidual capacitor.

When a ferroelectric material film, which has a negative capacitance, and a paraelectric material film, which has a positive capacitance, are connected in series, the total capacitance value of the ferroelectric material film and the paraelectric material film connected to each other in series may increase. A transistor including a ferroelectric material film may have sub-threshold swing (SS) of less than about 60 mV/decade at normal temperature, using an increase in total capacitance value as described above.

The ferroelectric material film may have ferroelectric characteristics. The ferroelectric material film may include, for example, at least one of hafnium oxide, hafnium zirco-nium oxide, barium strontium titanium oxide, barium tita-nium oxide, and/or lead zirconium titanium oxide. Here, for example, hafnium zirconium oxide may be a material pro-duced by doping hafnium oxide with zirconium (Zr). In another example, hafnium zirconium oxide may be a com-pound of hafnium (Hf), zirconium (Zr), and oxygen (O).

The ferroelectric material film may further include a dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gado-linium (Gd), germanium (Ge), scandium (Sc), strontium (Sr), and/or tin (Sn). The kind of the dopant included in the ferroelectric material film may be varied in accordance with which ferroelectric material is included in the ferroelectric material film.

When the ferroelectric material film includes hafnium oxide, the dopant included in the ferroelectric material film may include, for example, at least one of gadolinium (Gd), silicon (Si), zirconium (Zr), aluminum (Al), and/or yttrium (Y). When the dopant is aluminum (Al), the ferroelectric material film may include about 3 to about 8 atomic percent (at %) of aluminum. Here, the ratio of the dopant may be the ratio of aluminum to the sum of hafnium and aluminum. When the dopant is silicon (Si), the ferroelectric material film may include about 2 to about 10 at % of silicon. When the dopant is yttrium (Y), the ferroelectric material film may include about 2 to about 10 at % of yttrium. When the dopant is gadolinium (Gd), the ferroelectric material film may include about 1 to about 7 at % of gadolinium. When the dopant is zirconium (Zr), the ferroelectric material film may include about 50 to about 80 at % of zirconium.

The paraelectric material film may have paraelectric characteristics. The paraelectric material film may include, for example, at least one of silicon oxide and/or a metal oxide having a high dielectric constant. The metal oxide included in the paraelectric material film may include, for example, at least one of hafnium oxide, zirconium oxide, and/or aluminum oxide, and the present inventive concept is not limited thereto.

The ferroelectric material film and the paraelectric material film may include the same material as each other. The ferroelectric material film has ferroelectric characteristics, but the paraelectric material film might not have ferroelectric characteristics. For example, when both the ferroelectric material film and the paraelectric material film include hafnium oxide, the crystalline structure of the hafnium oxide included in the ferroelectric material film may differ from the crystalline structure of the hafnium oxide included in the paraelectric material film.

The ferroelectric material film may have a thickness exhibiting ferroelectric, characteristics. The thickness of the ferroelectric material film may be, for example, about 0.5 to about 10 nm, and the present inventive concept is not limited thereto. For example, the predetermined thickness exhibiting ferroelectric characteristics may be varied in accordance with different ferroelectric materials and, as such, the thickness of the ferroelectric material film may be varied in accordance with the ferroelectric material thereof.

In an exemplary embodiment of the present inventive concept, a gate insulating layer may include one ferroelectric material film. In an exemplary embodiment of the present inventive concept, a gate insulating layer may include a plurality of ferroelectric material films spaced apart from one another. In an exemplary embodiment of the present inventive concept, a gate insulating film may have a stacked film structure in which a plurality of ferroelectric material films and a plurality of paraelectric material films are alternately stacked on each other.

The gate capping layer 125 may be disposed on the gate electrode 123, the gate insulating layer 121, and the gate spacers SP. For example, the gate capping layer 125 may include silicon nitride.

In an exemplary embodiment of the present inventive concept, the gate capping layer 125 may have different heights in the second direction (e.g., the Y direction). The gate capping layer 125 may have different heights in the first and second device areas RX1 and RX2 and the field area FD. The gate capping layer 125 may have a first height Ta in the first and second device areas RX1 and RX2, and may have a second height Tb greater than the first height Ta in the field area FD. Here, the first height Ta may be a maximum height of the gate capping layer 125 in the first and second device areas RX1 and RX2, and the second height Tb may be a maximum height of the gate capping layer 125 in the field area FD. In addition, the levels of uppermost ends E1 and E2 of the gate capping layer 125 in the first and second device areas RX1 and RX2 and the field area FD with reference to an upper surface of the substrate 101 may be different from each other. A level LVa of the uppermost end E1 of the gate capping layer 125 in the first and second device areas RX1 and RX2 may be lower than a level LVb of the uppermost end E2 of the gate capping layer 125 in the field area FD. The level of a lowermost end of the gate capping layer 125 may be uniform in the second direction (e.g., the Y direction). The height of the gate structures GS may be varied in the second direction (e.g., the Y direction) in accordance with a variation in the height of the gate capping layer 125 and, as such, the gate structure GS may have a greater height in the field area FD than in the first and second device areas RX1 and RX2.

In the active region 105, a recess region, from which the upper portion of the active region 105 that protrude upwards from the first element isolation layer 107 is partially removed, may be formed. For example, the recess region may be formed between adjacent upper portions of the active region 105 that protrude upwards from the first element isolation layer 107. The recess region may be formed among the gate structures GS. A source/drain region S/D may be disposed in the recess region among the gate structures GS. The source/drain region S/D may include an epitaxially-grown semiconductor layer. For example, the source/drain region S/D may include at least one of an epi axially-grown Si layer, an epitaxially-grown SiC layer, and/or an epitaxially-grown SiGe layer.

Source/drain contact patterns CA may be disposed on source/drain regions S/D. The source/drain regions S/D may be electrically connected to an upper wiring layer via the source/drain contact patterns CA. Each of the source/drain contact patterns CA may include a barrier layer 145 and a plug layer 147. The barrier layer 145 may cover a sidewall and a bottom surface of the plug layer 147. For example, the barrier layer 145 may include Ti, Ta, TiN, TaN, or a combination thereof, and the plug layer 147 may include W, Co, Cu, Ru, Mn, or a combination thereof.

Silicide films 141 may be formed between the source/drain regions S/D and the source/drain contact patterns CA. For example, the silicide films 141 may include titanium silicide. Contact spacers 143 may be formed at sidewalls of the source/drain contact patterns CA. For example, the contact spacers 143 may include SiN, SiCN, SiCON, or a combination thereof, and the present inventive concept is not limited thereto.

The source/drain contact patterns CA may have different heights based on their respective positions. The source/drain contact patterns CA may include a first portion P1 and a second portion P2 that are interconnected to be integrated with each other while having different heights from each other. On the active region 105, the first portion P1 of the source/drain contact pattern CA may have a first height, and the second portion P2 of the source/drain contact pattern CA may have a second height greater than the first height. In an exemplary embodiment of the present inventive concept, with reference to the upper surface of the substrate 101, the level of an upper end of the first portion P1 is lower than the level of an upper surface of the gate electrode 123, and the level of an upper end of the second portion P2 may be higher than the level of the upper surface of the gate electrode 123. The present inventive concept is not limited to the above-described conditions, and the levels of respective upper ends of the first portion P1 and the second portion P2 may be higher than the level of the upper surface of the gate electrode 123.

Gate contacts CB may be connected to gate electrodes 123 while extending through gate capping layers 125 in the third direction (e.g., the Z direction). The gate contacts CB may be disposed at a level lower than the level LVb of the uppermost end of the gate structure GS with reference to the upper surface of the substrate 101. For example, the gate contacts CB may be disposed at a level lower than the uppermost end E2 of the gate capping layer 125.

In an exemplary embodiment of the present inventive concept, the gate structures GS may include a first gate structure GS1 and a second gate structure GS2 spaced apart from each other in the first direction (e.g., the X direction), and the gate contacts CB may include a first gate contact CB1 and a second gate contact CB2. The first gate contact CB1 may be connected to the first gate structure GS1, and the second gate contact CB2 may be connected to the second gate structure GS2. The first gate contact CB1 may be connected to the first gate structure GS1 in the first device area RX1, and the second gate contact CB2 may be connected to the second gate structure GS2 in the field area FD.

The first gate contact CB1 may be connected to the gate electrode 123 (first gate electrode) while extending through the gate capping layer 125 (first gate capping layer) of the first gate structure GS1. The first gate contact CB1 may have a first minimum width Wa. The first minimum width Wa may be the width in the first direction (e.g., the X direction) of the first gate contact CB1, and may be a minimum horizontal distance between a lower end of one sidewall of the first gate contact CB1 and a lower end of the other sidewall of the first gate contact CB1 facing the one sidewall. For example, the first gate contact CB1 may have a tapered shape. The first gate contact CB1 may have a first height Ha. The first height Ha may be a vertical distance from a lower end to an upper end of the first gate contact CB1.

The second gate contact CB2 may be connected to the gate electrode 123 (second gate electrode) while extending through the gate capping layer 125 (second gate capping layer) of the second gate structure GS2. The second gate contact CB2 may have a second minimum width Wb different from the first minimum width Wa. The second minimum width Wb may be the width in the first direction (e.g., the X direction) of the second gate contact CB2, and may be a minimum horizontal distance between a lower end of one sidewall of the second gate contact CB2 and a lower end of the other sidewall of the second gate contact CB2 facing the one sidewall. For example, the second minimum width Wb may be smaller than the first minimum width Wa. For example, the second gate contact CB2 may have a tapered shape. The second gate contact CB2 may have a second height Hb. The second height Hb may be a vertical distance from a lower end to an upper end of the second gate contact CB2. The second height Hb may be greater than the first height Ha. As the first gate contact CB1 is disposed in the first device area RX1, the first gate contact CB1 may contribute to reduction in the size of the logic cell LC by reducing an area required by the field area FD. In addition, the first gate contact CB1 may have a relatively great width and a relatively small length, as compared to the second gate contact CB2, and, as such, may reduce a resistance value.

In an exemplary embodiment of the present inventive concept, a first maximum width of the first gate contact CB1 may be greater than a second maximum width of the second gate contact CB2. The first maximum width may be the width in the first direction (e.g., the X direction) of the first gate contact CB1, and may be the width of an upper surface of the first gate contact CB1. The second maximum width may be the width in the first direction (e.g., the X direction) of the second gate contact CB2, and may be the width of an upper surface of the second gate contact CB2. As a result, the first gate contact CB1 may have greater widths than the second gate contact CB2 at both the upper and lower ends thereof and, as such, may have a lower resistance value than the second gate contact CB2.

In an exemplary embodiment of the present inventive concept, the second portion P2 included in each of the source/drain contact patterns CA disposed adjacent to opposite sides of the first gate contact CB1 might not overlap with the first gate contact CB1 in the first direction (e.g., the X direction). First portions P1 having a relatively small height may be disposed at opposite sides of the first gate contact CB1 and, as such, a distance may be secured between the first gate contact CB1 and the source/drain contact pattern CA, thereby preventing generation of parasitic capacitance.

Buried insulating layers 150 may be disposed on the source/drain contact patterns CA. The buried insulating layers 150 may be disposed on the first portion P1 of the source/drain contact pattern CA, and may contact at least a portion of a side surface of the second portion P2. The buried insulating layers 150 may cover a part of the gate capping layers 125. The buried insulating layers 150 may include, for example, silicon oxide, SiOC, SiOCN, SiON, SiCN, SiN, or a combination thereof, and the preset inventive concept is not limited thereto.

A first interlayer insulating layer 110 may be disposed on the first element isolation layer 107 and the second element isolation layer 109. The first interlayer insulating layer 110 may be disposed among the gate structures GS in the field area FD. For example, the first interlayer insulating layer 110 may be disposed on opposing side surfaces of the gate structure GS in the field area FD. The first interlayer insulating layer 110 may cover the source/drain regions S/D, the contact spacers 143, and the buried insulating layer 150. A second interlayer insulating layer 170 may be disposed on the first interlayer insulating layer 110. The second interlayer insulating layer 170 may cover an upper surface of the gate capping layer 125 and an upper surface of the buried insulating layer 150 in the first and second device areas RX1 and RX2. The second interlayer insulating layer 170 may cover the upper surface of the gate capping layer 125 and an upper surface of the first interlayer insulating layer 110 in the field area FD.

Each of the first interlayer insulating layer 110 and the second interlayer insulating layer 170 may include, for example, oxide, nitride, ultralow-k dielectrics having an ultralow dielectric constant K of about 2.2 to about 2.4, or a combination thereof. For example, each of the first interlayer insulating layer 110 and the second interlayer insulating layer 170 may include tetraethylorthosilicate (TEOS), a high density plasma (HDP) oxide, borophosphosilicate glass (BPSG), a flowable chemical vapor deposition (FCVD) oxide, SiON, SiN, SiOC, SiCOH, or a combination thereof.

First vias VA1 may be disposed on the source/drain contact patterns CA. For example, the first via VA1 may contact an upper surface of the second portion P2 of the source/drain contact pattern CA while extending through the second interlayer insulating layer 170. Second vias VA2 may be disposed on the gate contacts CB. For example, the second vias VA2 may contact upper surfaces of the gate contacts CB while extending through the second interlayer insulating layer 170.

Each of the first vias VA1 and the second vias VA2 may include, for example, a barrier layer and a buried metal layer. For example, the barrier layer may include Ti, Ta, TiN, TaN, or a combination thereof, and the buried metal layer may include Co, Cu, W, Ru, Mn, or a combination thereof.

In the logic cell LC, a power line VDD may be connected to the active region 105 disposed in the first device area RX1 via a part of the source/drain contact patterns CA, and a ground line VSS may be connected to the active region 105 disposed in the second device area RX2 via another part of the source/drain contact patterns CA. The power line VDD and the ground line VSS may be disposed at a level higher than an upper surface of the source/drain contact pattern CA. Each of the power line VDD and the ground line VSS may include, for example, a barrier layer and a conductive wiring layer. The barrier layer may include, for example, Ti, Ta, TiN, TaN, or a combination thereof, and the conductive wiring layer may include, for example, Co, Cu, W, an alloy thereof, or a combination thereof.

Figure 3:
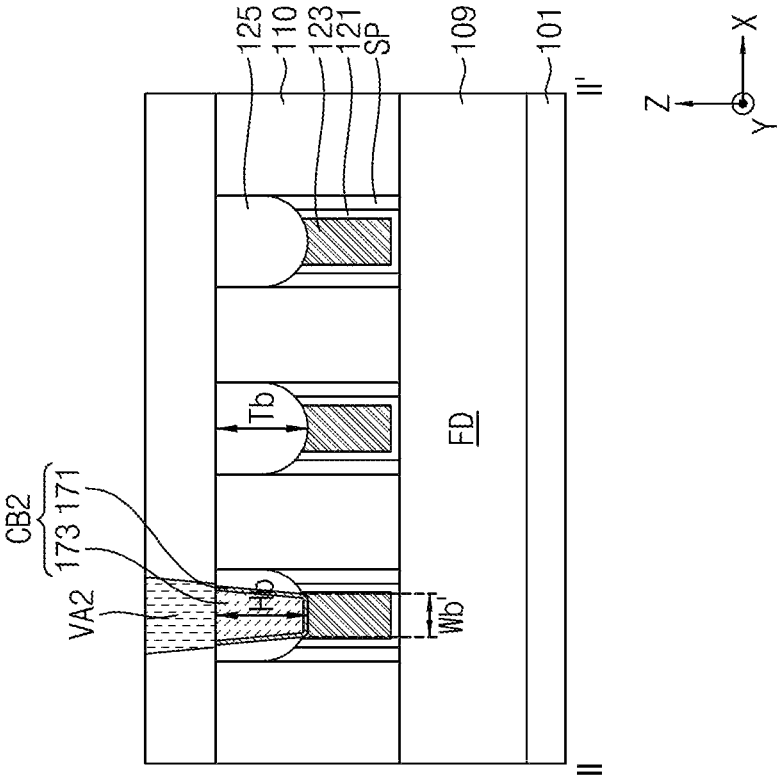
FIG. 3 is cross-sectional views taken along lines I-I' and II-II' in FIG. 1 according to an exemplary embodiment of the present inventive concept.
Figure 3:
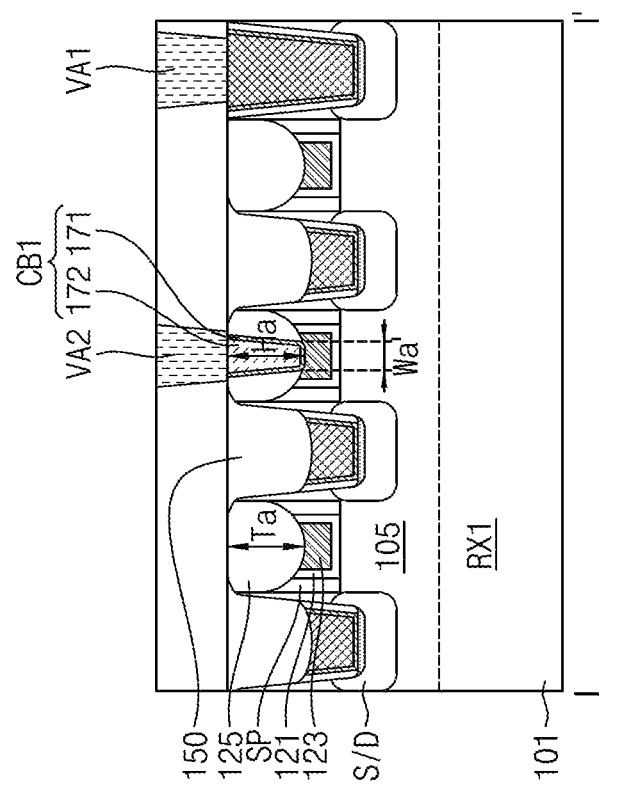

FIG. 3 illustrate cross-sectional views taken along lines I-I' and II-II' in FIG. 1 in accordance with an exemplary embodiment of the present inventive concept.

Referring to FIG. 3, a first minimum width Wa' of a first gate contact CB1 may be smaller than a second minimum width Wb' of a second gate contact CB2. As the first gate contact CB1 has a relatively small width, the first gate contact CB1 may secure a distance from a second portion P2 of a source/drain contact pattern CA disposed adjacent thereto and, as such, may reduce parasitic capacitance. In addition, a process margin between the first gate contact CB1 and the second portion P2 of the source/drain contact pattern CA may be secured and, as such, short circuit between the first gate contact CB1 and the second portion P2 may be prevented. As the second gate contact CB2 has a relatively large width, the second gate contact CB2 may reduce a resistance value.

In an exemplary embodiment of the present inventive concept, the first gate contact CB1 may have a smaller maximum width than the second gate contact CB2. Here, the maximum width may be a width in a first direction X of an upper surface of the first gate contact CB1.

FIGS. 4A to 14B are cross-sectional views shown in accordance with a process sequence to illustrate a method for manufacturing an integrated circuit device in accordance with an exemplary embodiment of the present inventive concept. FIGS. 4A, 5A, 6A, 7A, 8A, 9A, 10A, 11A, 12A, 13A, and 14A are cross-sectional views taken along lines I-I' and II-II' in FIG. 1 and shown in accordance with a process sequence. FIGS. 4B, 5B, 6B, 7B, 8B, 9B, 10B, 11B, 12B, 13B, and 14B are cross-sectional views taken along lines III-III' and IV-IV' in FIG. 1 and shown in accordance with a process sequence.

Figure 4A:
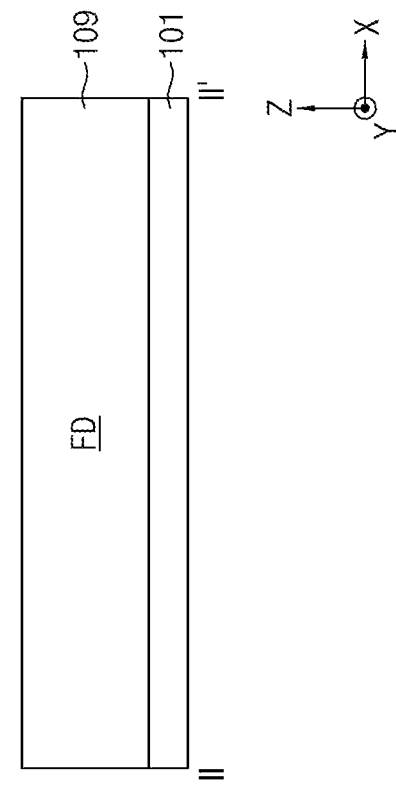
Figure 4A:
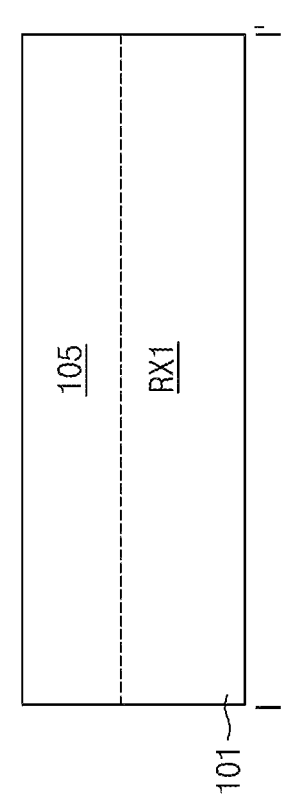
Figure 4B:
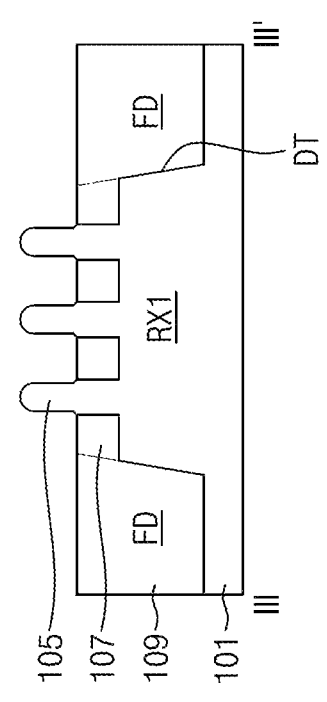

Referring to FIGS. 1, 4A, and 4B, a substrate 101 may be partially etched, thereby forming active regions 105 protruding upwards (e.g., in a Z direction) from an upper surface of the substrate 101 while extending in a first direction (e.g., the X direction). The active regions 105 may be fin-type active regions having a fin shape. The active regions 105 may be formed in each of a first device area RX1 and a second device area RX2.

A first element isolation layer 107 may be formed on lower sidewalls of the active regions 105. The active regions 105 may protrude upwards from an upper surface of the first element isolation layer 107. A portion of the first element isolation layer 107 and a portion of the substrate 101 may be etched, thereby forming a deep trench DT dividing the first device area RX1 and the second device area RX2 from each other, and a second element isolation layer 109 may be formed to fill the deep trench DT. The second element isolation layer 109 may be formed in a field area FD between the first device area RX1 and the second device area RX2. The field area FD may correspond to an area in which the deep trench DT and the second element isolation layer 109 are formed.

Figure 5A:
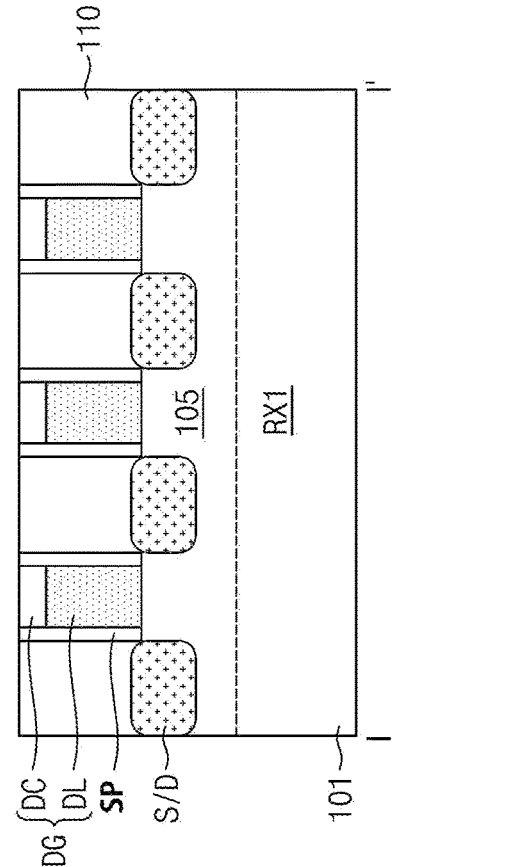
Figure 5B:
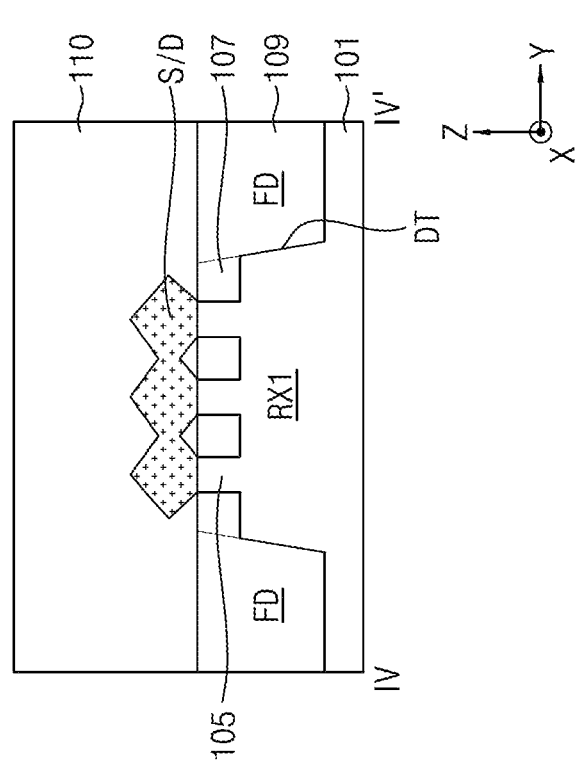
Figure 5B:
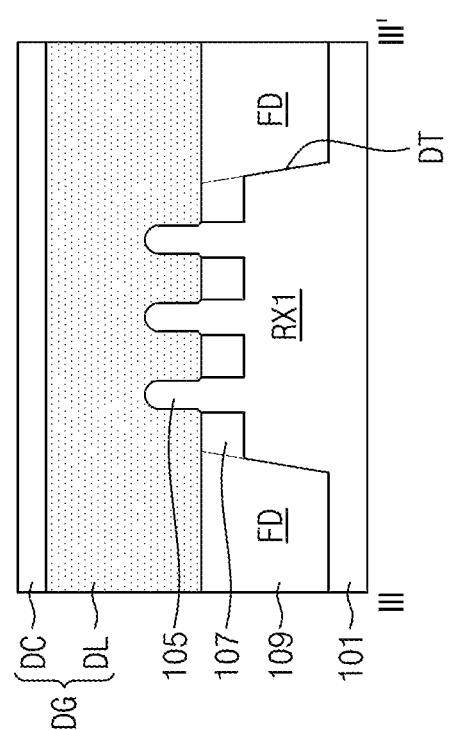

Referring to FIGS. 5A and 5B, dummy gate structures DG may be formed to extend in a second direction (e.g., the Y direction) while intersecting the active regions 105, and may be formed on the first element isolation layer 107 and the second element isolation layer 109. Each of the dummy gate structures DG may include a dummy gate line DL and a dummy gate capping layer DC. For example, the dummy gate line DL may include silicon oxide and/or polysilicon, and the dummy gate capping layer DC may include silicon nitride.

Gate spacers SP may be formed at opposite sidewalls of each of the dummy gate structures DG, and the active regions 105, which are exposed at opposite sides of each dummy gate structure DG, may be partially etched, thereby forming recess regions at opposite sides of each of the dummy gate structures DG. Source/drain regions S/D may be formed in the recess regions, respectively. A first inter-layer insulating layer 110 may be formed to cover the first element isolation layer 107, the second element isolation layer 109, the source/drain regions S/D and the gate spacers SP among the dummy gate structures DG.

Figure 6A:
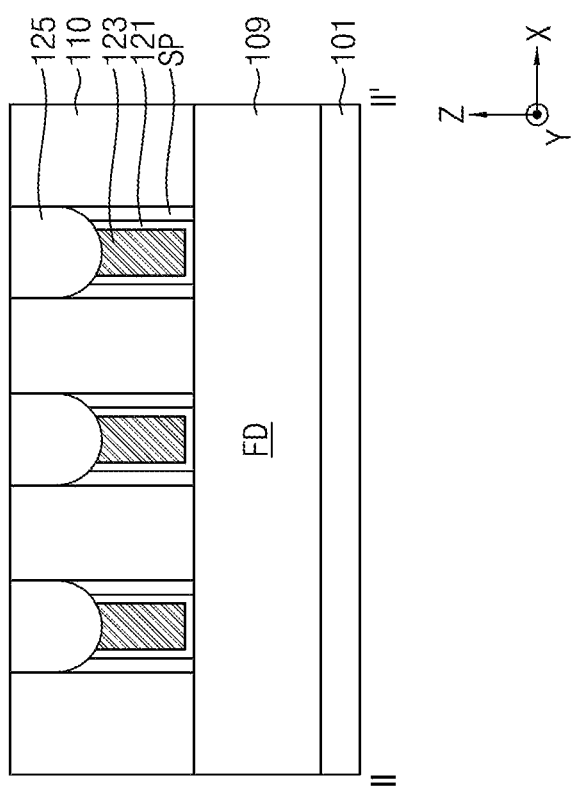
Figure 6A:
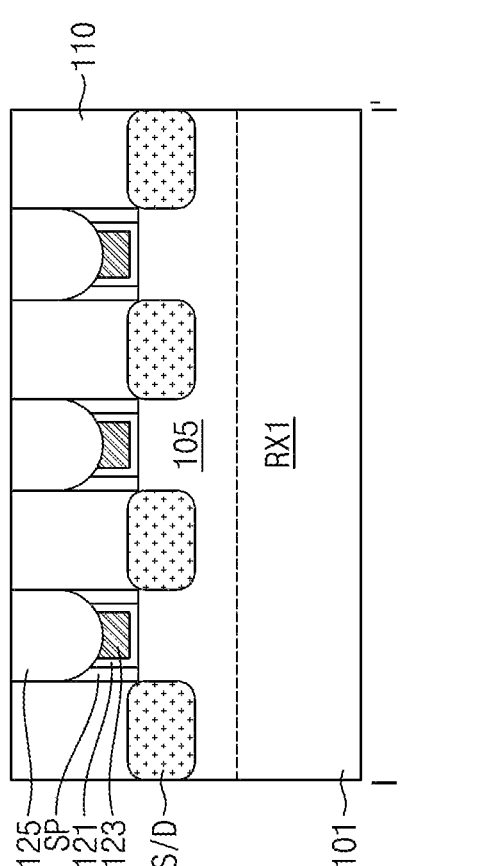
Figure 6B:
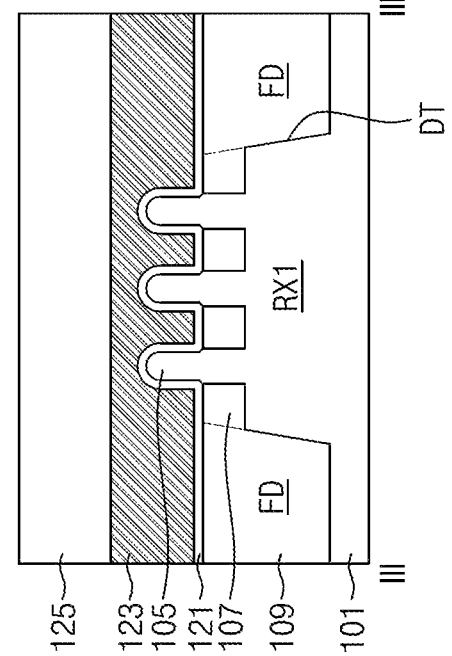

Referring to FIGS. 6A and 6B, the dummy gate structures DG may be removed from the resultant structure of FIGS. 5A and 5B, thereby forming a gate space among the gate spacers SP. A gate insulating layer 121, a gate electrode 123, and a gate capping layer 125 may be formed in the gate space. First, the gate insulating layer 121 and the gate electrode 123 may be formed to fill the gate space. There-after, upper portions of the gate insulating layer 121 and the gate electrode 123 may be partially removed through an etch-back process. During the etch-back process, an upper portion of the gate spacer SP may also be partially removed. Subsequently, the gate capping layer 125 may be formed to cover an upper surface of each of the gate insulating layer 121, the gate electrode 123 and the gate spacer SP.

In an exemplary embodiment of the present inventive concept, an interface layer covering surfaces of the active regions 105 exposed through the gate space may be formed before formation of the gate insulating layer 121. The interface layer may be formed by oxidizing a portion of the active region 105.

Figure 7A:
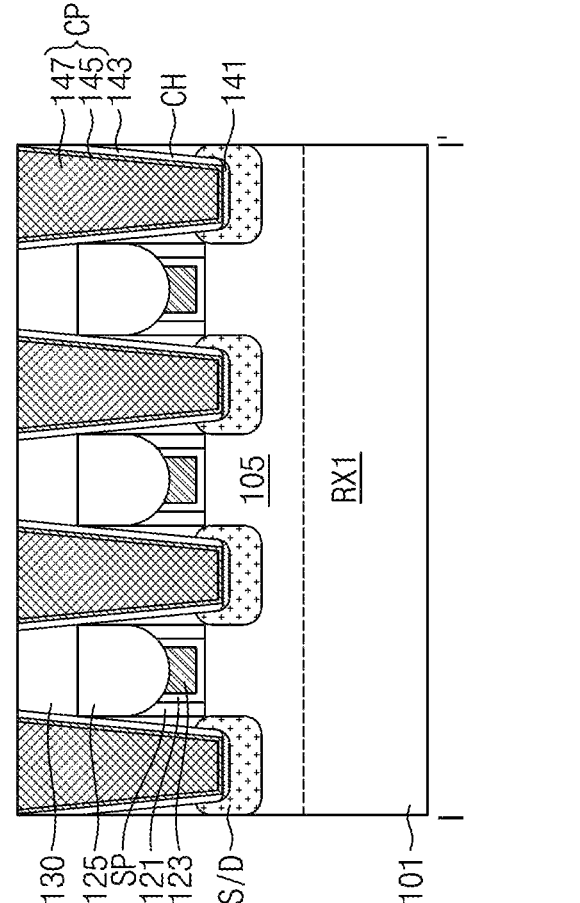
Figure 7B:
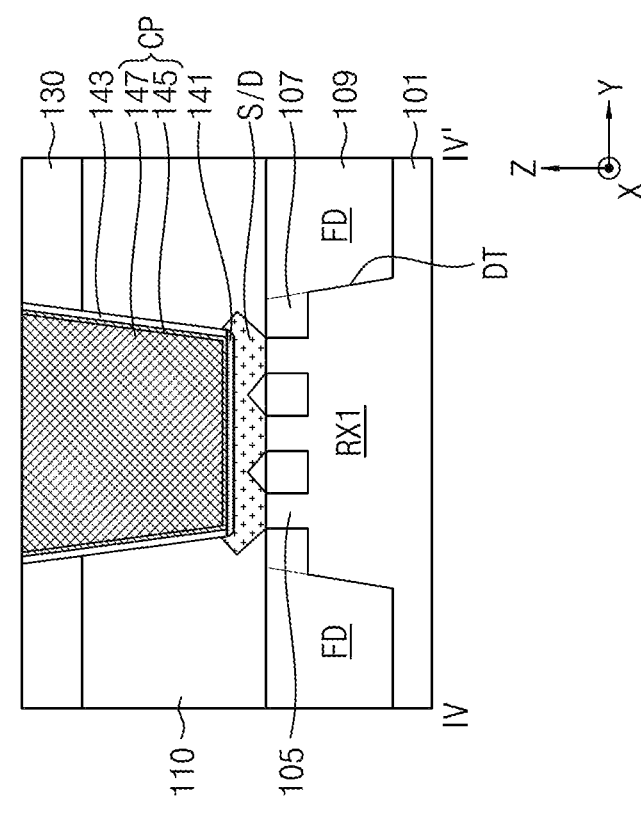
Figure 7B:
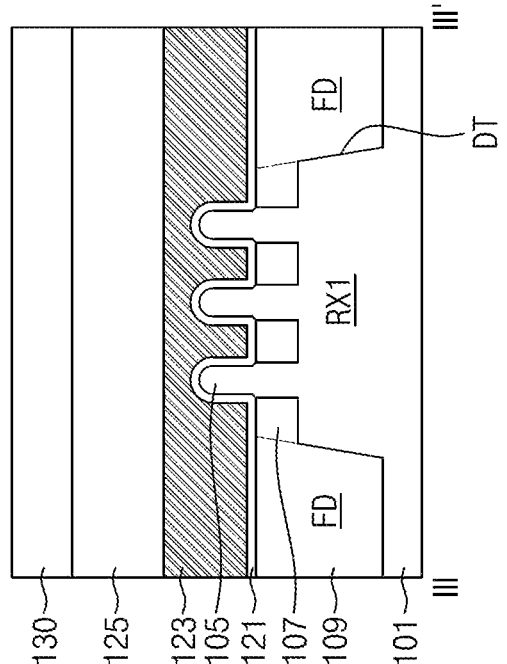

Referring to FIGS. 7A and 7B, a first upper insulating layer 130 may be formed to cover an upper surface of the gate capping layer 125 and an upper surface of the first interlayer insulting layer 110. Thereafter, source/drain con-tact holes CH may be formed to extend through the first upper insulating layer 130 and the first interlayer insulating layer 110, thereby exposing the source/drain regions S/D. In a procedure of forming the source/drain contact holes CH, the source/drain region S/D may be partially etched. Sub-sequently, a contact spacer 143 may be formed to cover an inner sidewall of the source/drain contact hole CH. The contact spacer 143 may be formed by forming an insulating layer conformally covering the inner sidewall of the source/drain contact hole CH, and partially etching the insulating layer through anisotropic etching. As the insulating layer is partially removed through the anisotropic etching, the source/drain region S/D may be exposed, and may be partially removed.

A silicide layer 141 may be formed in the source/drain contact hole CH and may cover the source/drain region S/D, and a source/drain contact CP may be formed on the silicide layer 141 to fill the source/drain contact hole CH. The source/drain contact CP may include a barrier layer 145 and a plug layer 147.

Figure 8A:
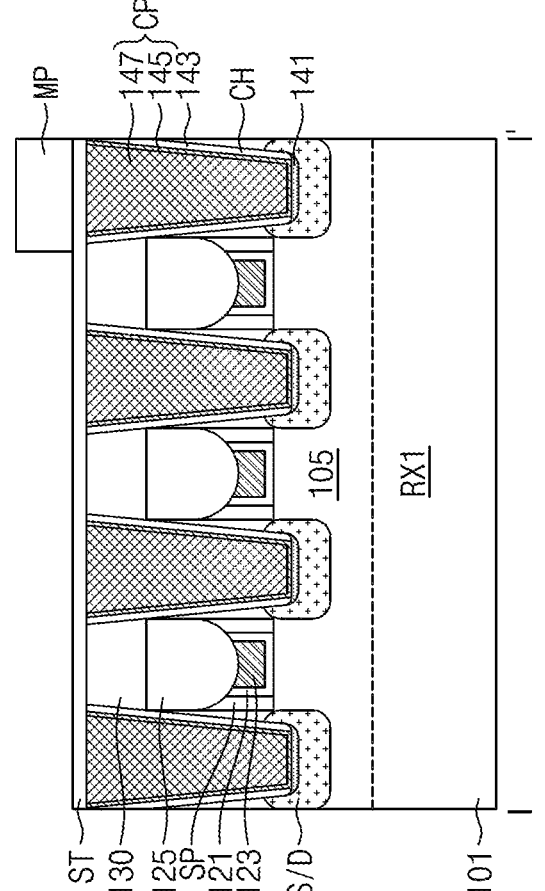
Figure 8B:
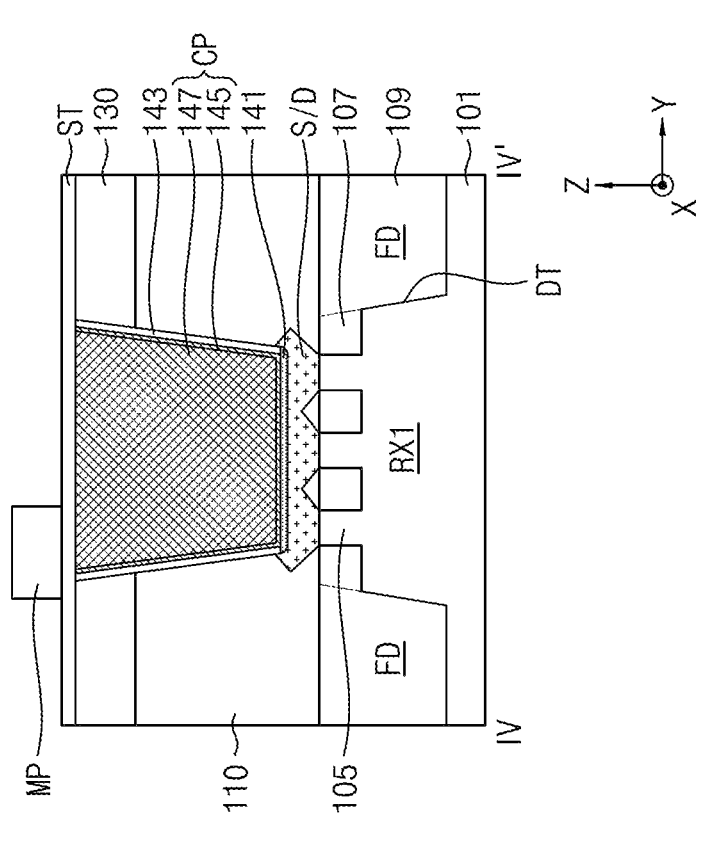
Figure 8B:
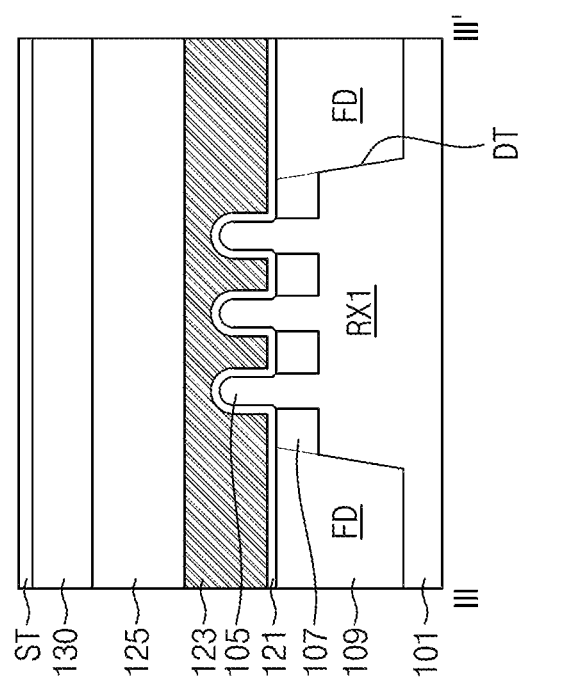

Referring to FIGS. 8A and 8B, an etch stop layer ST may be formed to cover upper surfaces of the source/drain contacts CP and the first upper insulating layer 130, and mask patterns MP may be formed on the etch stop layer ST. The mask patterns MP may be formed to vertically overlap with a part of the source/drain contacts CP. For example, the mask patterns MP may be formed to be disposed at positions corresponding to the first vias VA1 shown in FIG. 1, respectively.

The etch stop layer ST may include, for example, SiOC, SiN, or a combination thereof. The mask patterns MP may include, for example, silicon oxide, a spin-on hardmask, a photoresist layer, or a combination thereof.

Figure 9A:
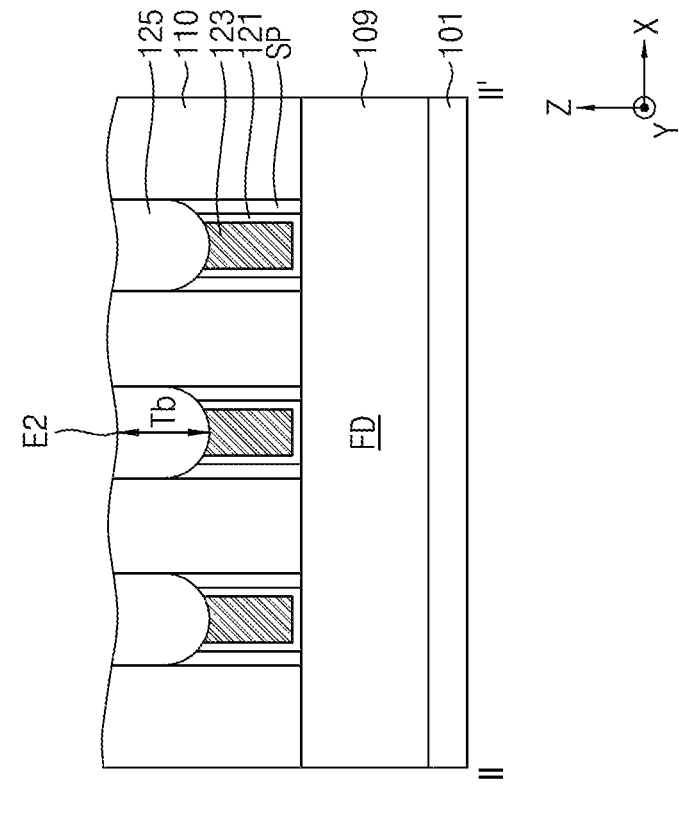
Figure 9A:
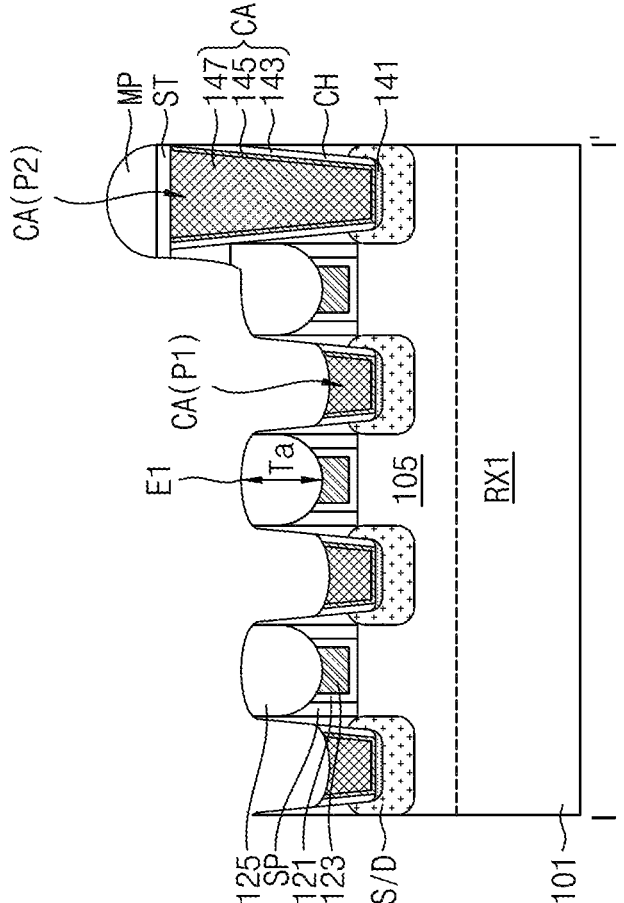
Figure 9B:
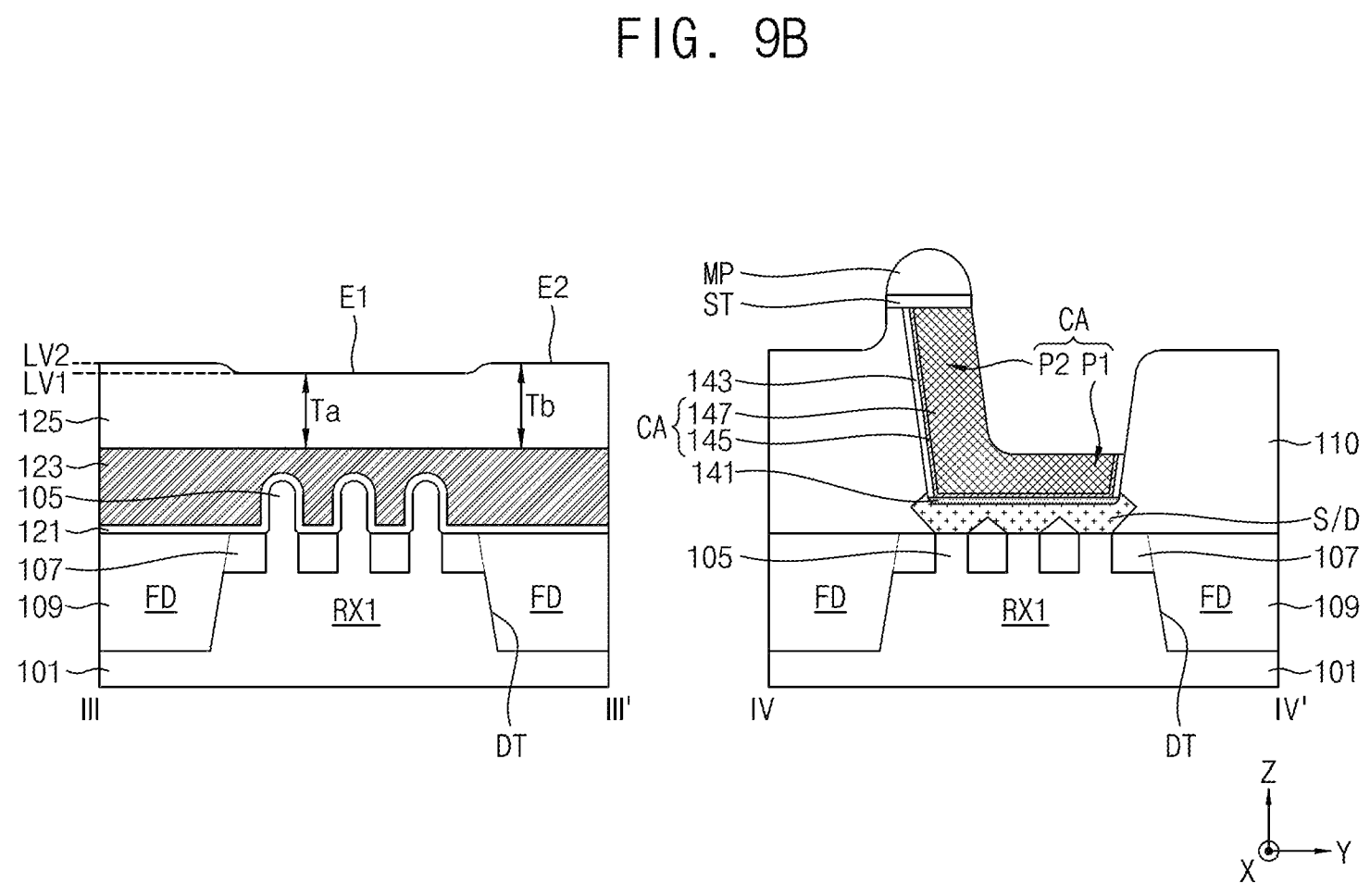

Referring to FIGS. 9A and 9B, the etch stop layer ST may be etched through an etching process using the mask patterns MP as an etch mask, and an exposed part of the source/drain contacts CP may be partially etched in a first etching atmosphere. As the exposed part of the source/drain contacts CP is partially etched in the first etching atmosphere, source/drain contact patterns CA, which has portions with different heights in accordance with different positions of the portions, may be formed. Each of the source/drain contact patterns CA may be formed to include a first portion P1 and a second portion P2 interconnected to be integrated with each other while having different heights from each other.

The first etching atmosphere may be an etching atmosphere for etching a metal-containing layer constituting the source/drain contacts CP. The first etching atmosphere may be an etching atmosphere in which an etching amount of the metal-containing layer constituting the source/drain contacts CP is greater than etching amounts of insulating layers respectively constituting the gate capping layers 125 and the first upper insulating layer 130, but the etching amounts of the insulating layers respectively constituting the gate capping layers 125 and the first upper in layer 130 are greater than 0.

In an exemplary embodiment of the present inventive concept, in the first etching atmosphere for etching the exposed part of the source/drain contacts CP, an etching amount of the metal-containing layer constituting the source/drain contacts CP, for example, a tungsten layer, may be greater than an etching amount of the insulating layer constituting the gate capping layers 125, for example, a silicon nitride layer, and may be greater than an etching amount of the insulating layer constituting the first upper insulating layer 130, for example, a silicon oxide layer. In the first etching atmosphere, the etching amount of the insulating layer constituting the gate capping layer 125 may be greater than the etching amount of the insulating layer constituting the first upper insulating layer 130. For example, the ratio of the etching amount of the metal-containing layer constituting the source/drain contacts CP, the etching amount of the insulating layer constituting the gate capping layer 125, and the etching amount of the insulating layer constituting the first upper insulating layer 130 may be about 6:3:1, and the present inventive concept is not limited thereto.

As a result, portions of the gate capping layers 125 and at least a portion of the first upper insulating layer 130, which are simultaneously exposed to the first etching atmosphere during etching of the exposed part of the source/drain contacts CP using the mask patterns MP as an etch mask, may be etched. For example, almost all of the first upper insulating layer 130 may be removed and, as such, the upper surface of the gate capping layer 125 may be exposed, and an upper portion of the gate capping layer 125 may be partially removed, thereby causing the gate capping layer 125 to have a reduced height.

The gate capping layers 125 may have different etching amounts in the first and second device areas RX1 and RX2 and the field area FD in the first etching atmosphere. For example, the gate capping layers 125 may have different etching amounts in the first etching atmosphere between a part thereof disposed among the source/drain contacts CP in the first direction (e.g., the X direction) and a part thereof not disposed among the source/drain contacts CP in the first direction (e.g., the X direction). In the first etching atmosphere, the source/drain contacts CP may be etched at a higher rate than the gate capping layers 125 and, as such, the height of the source/drain contacts CP may be lower than the height of the gate capping layers 125. Accordingly, side surfaces of the gate capping layers 125 may be partially exposed. Since the part of the gate capping layers 125 disposed among the source/drain contacts CP is exposed not only at the upper surface thereof, but also at the side surface thereof, the exposure area of the source/drain contacts CP may increase. As a result, the etching amount of the part of the gate capping layers 125 disposed in the first and second device areas RX1 and RX2 may be relatively high. In addition, since the part of the gate capping layers 125 disposed in the field area FD is exposed only at the upper surface thereof, and the side surface thereof is covered by the first interlayer insulating layer 110 having a relatively low etching rate, the part of the gate capping layers 125 disposed in the field area FD may have a relatively small etching amount. As a result, the gate capping layers 125 may have different heights in the first and second device areas RX1 and RX2 and the field area FD by an etching process in the first etching atmosphere. For example, the gate capping layers 125 may have different heights between the part thereof disposed among the source/drain contacts CP and the part thereof not disposed among the source/drain contacts CP. A height Ta of the gate capping layers 125 in the first and second device areas RX1 and RX2 may be smaller than a height Tb of the gate capping layers 125 in the field area FD. In addition, a level LV1 of an uppermost end of each gate capping layer 125 in the first and second device areas RX1 and RX2 may be lower than a level LV2 of an uppermost end of each gate capping layer 125 in the field area FD. Here, the height Ta of the gate capping layers 125 in the first and second device areas RX1 and RX2 may be a maximum height of the gate capping layers 125 in the first and second device areas RX1 and RX2, and the height Tb of the gate capping layers 125 in the field area FD may be a maximum height of the gate capping layers 125 in the field area FD.

From among the gate capping layers 125, the gate capping layer 125 disposed adjacent to the mask pattern MP may have an etching amount gradually decreasing as the gate capping layer 125 extends toward the mask pattern MP while having an etching amount gradually increasing as the gate capping layer 125 extends away from the mask pattern MP. Accordingly, in the case in which the mask pattern MP is formed over only one of two adjacent source/drain contacts CP, to extend in the first direction (e.g., the X direction), the gate capping layer 125 may include an asymmetrical capping layer having a varying thickness along the first direction (e.g., the X direction) between the two source/drain contacts CP. The first portion P1 of one source/drain contact pattern CA may be disposed at one side of the asymmetrical capping layer, and the second portion P2 of another source/drain contact pattern CA may be disposed at the other side of the asymmetrical capping layer. For example, the thickness of gate capping layer 125 may increase from the second portion P2 of the other source/drain contact pattern CA to the first portion P1 of the one source/drain contact pattern CA.

Figure 10A:
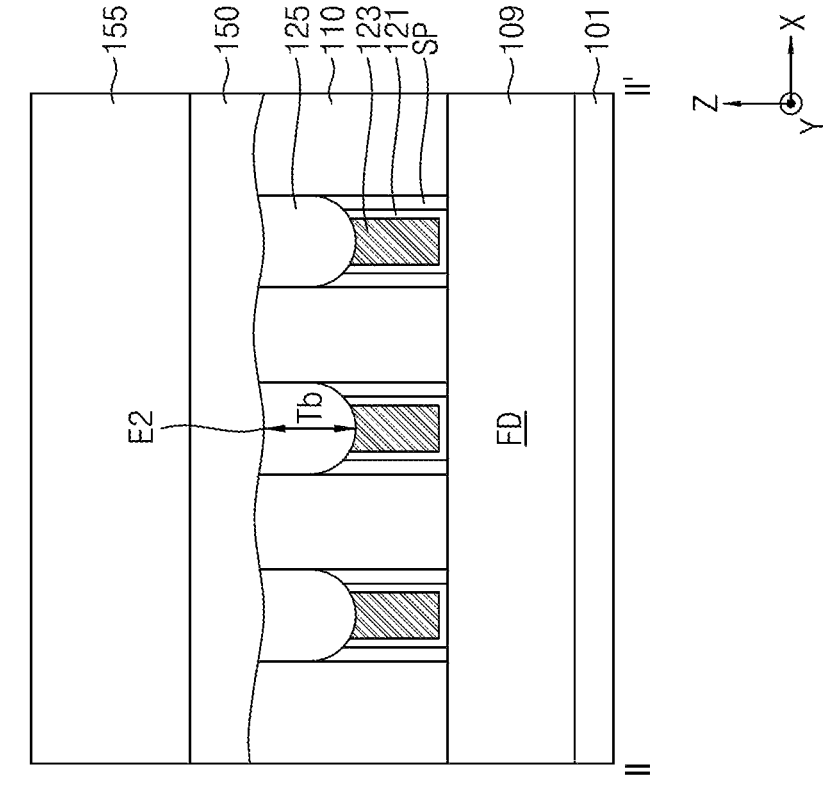
Figure 10A:
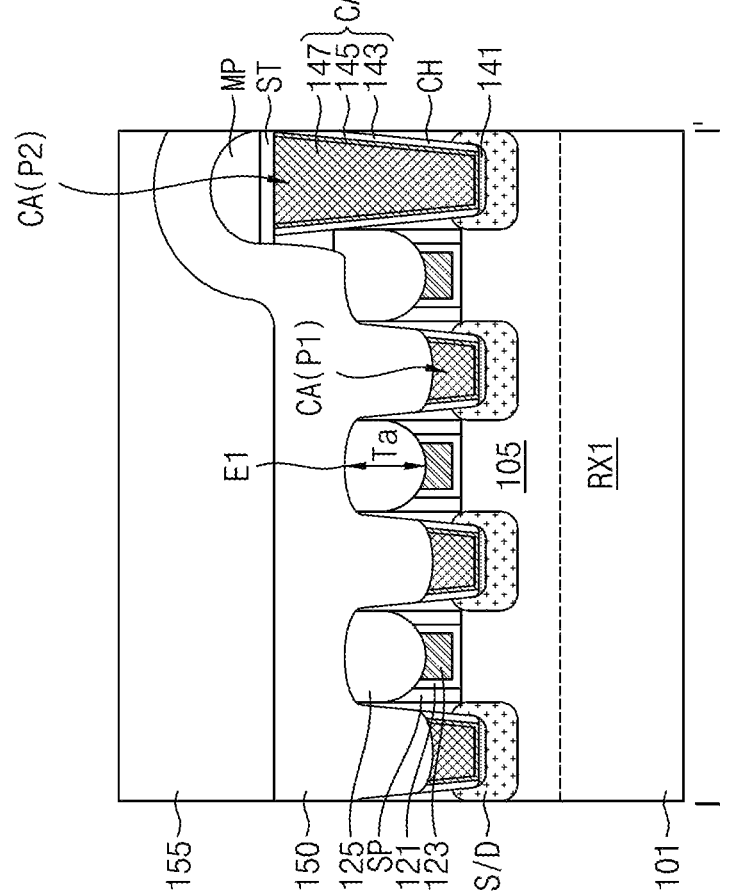
Figure 10B:
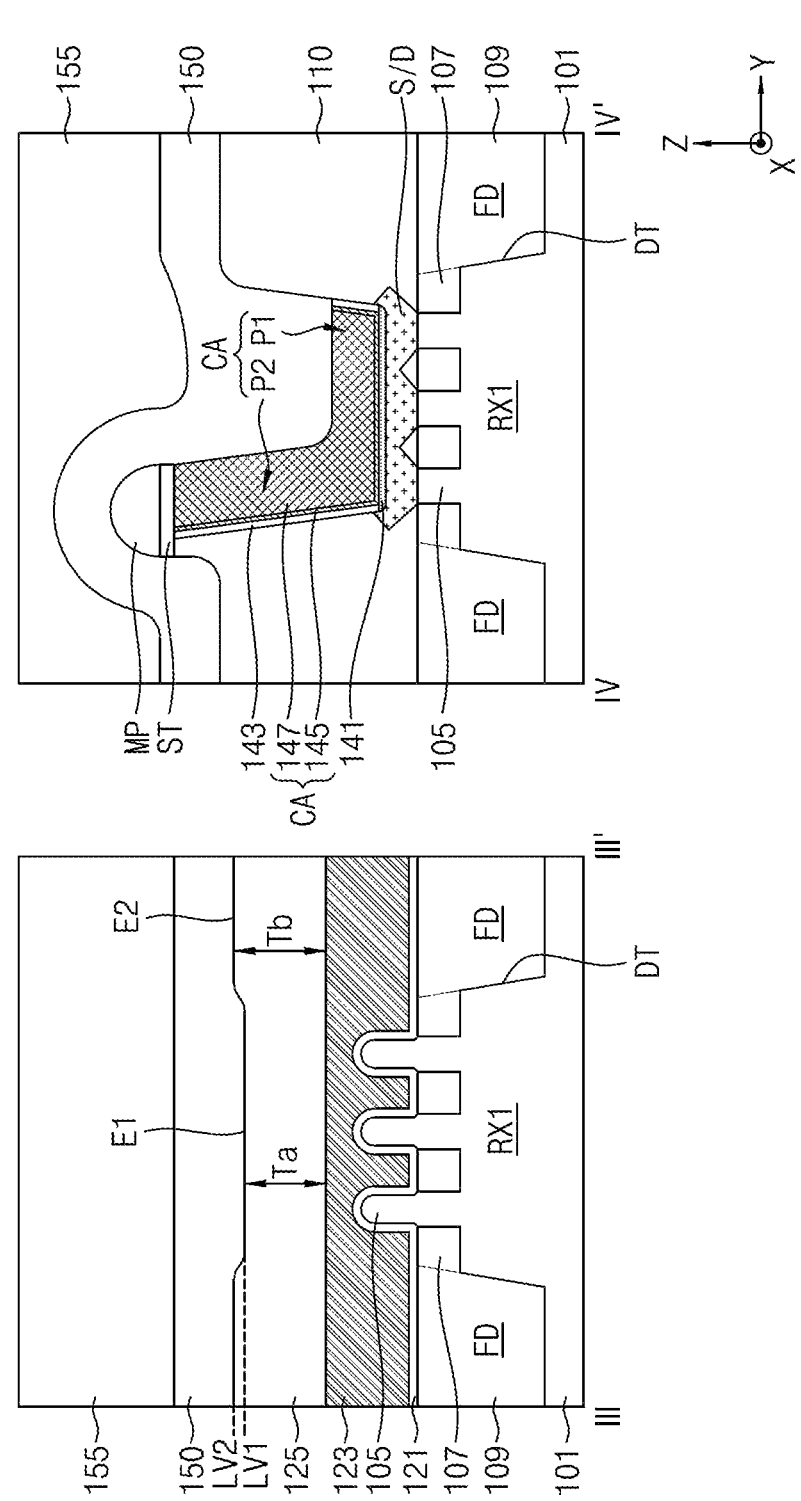

Referring to FIGS. 10A and 10B, a buried insulating layer 150 may be formed on the resultant structure of FIGS. 9A and 9B. The buried insulating layer 150 may cover the source/drain contact patterns CA, and may cover the gate capping layer 125 and the first interlayer insulating layer 110. In addition, the buried insulating layer 150 may cover the mask pattern MP. Thereafter, a second upper insulating layer 155 may be formed on the buried insulating layer 150. For example, the second upper insulating layer 155 may include oxide.

Figure 11A:
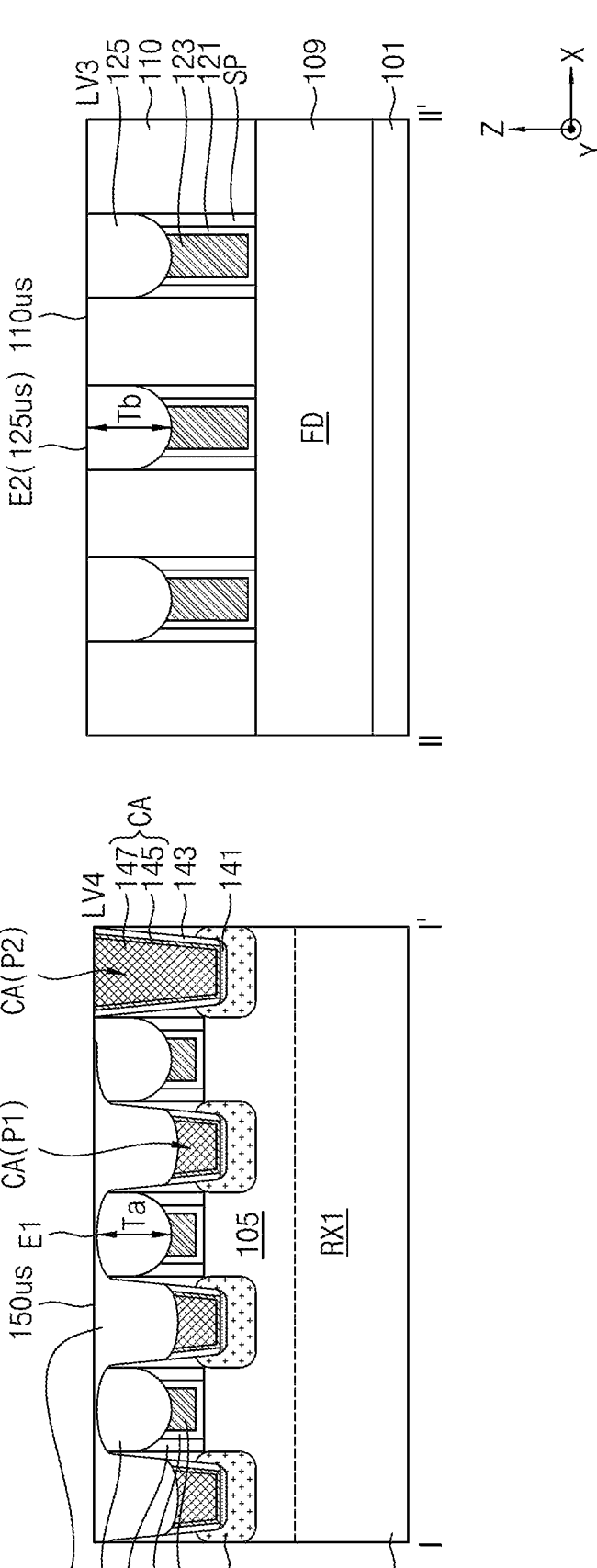
Figure 11B:
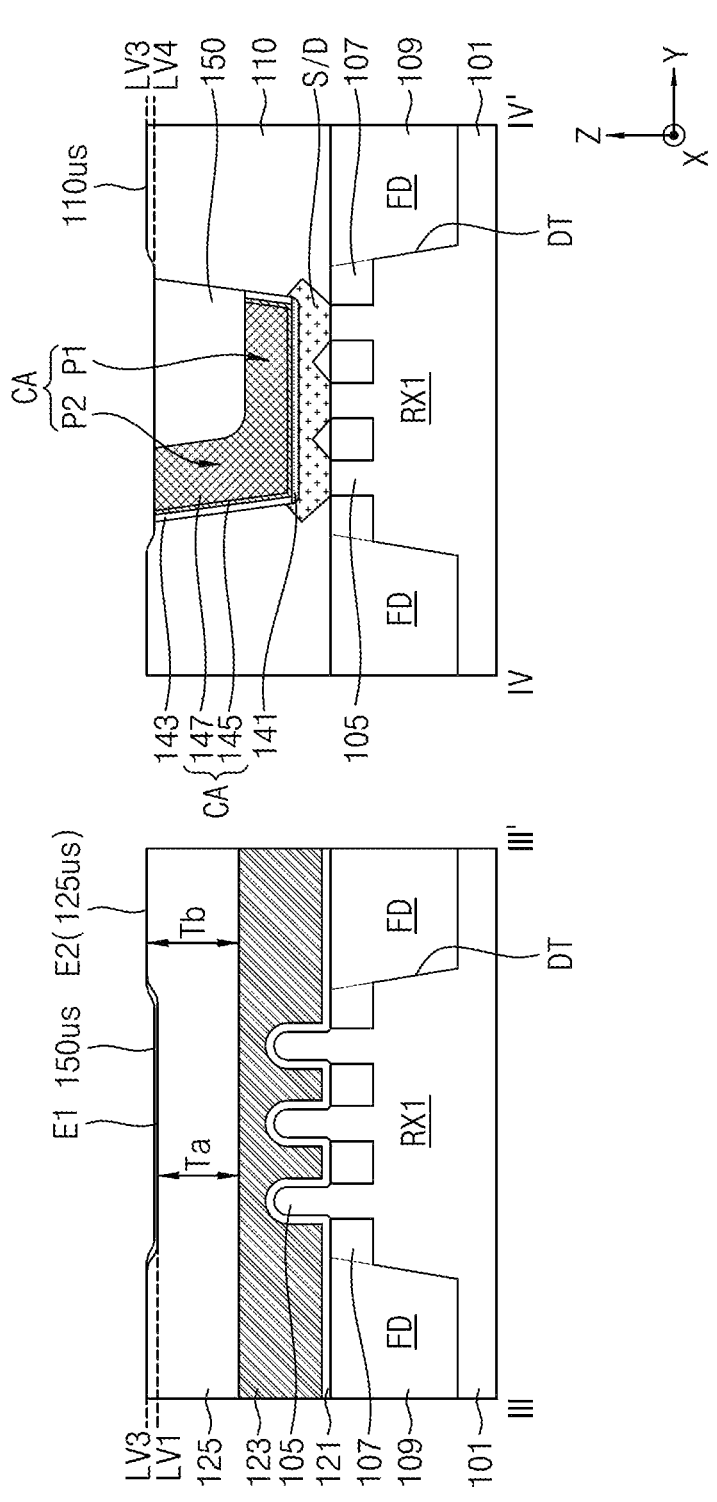

Referring to FIGS. 11A and 11B, a chemical mechanical polishing (CMP) process may be performed, thereby removing the second upper insulating layer 155, the mask pattern MP and the etch stop layer ST. In addition, the chemical mechanical polishing process may remove a portion of the source/drain contact pattern CA and a portion of the buried insulating layer 150. An upper surface of the second portion P2 of the source/drain contact pattern CA may be exposed by the CMP process. By the CMP process, an upper surface 150us of the buried insulating layer 150 may be exposed in the first and second device areas RX1 and RX2, and respective upper surfaces 125us and 110us of the gate capping layer 125 and the first interlayer insulating layer 110 may be exposed in the field area FD. For example, at least portions of the gate capping layer 125 might not be exposed in the first and second device areas RX1 and RX2. Of course, when the gate capping layer 125 includes an asymmetrical capping layer, an upper end of the asymmetrical layer may be exposed.

In an exemplary embodiment of the present inventive concept, the CMP process may be performed using the gate capping layer 125 and/or the first interlayer insulating layer 110 as a polishing stop layer. For example, the CMP process may be performed until the upper surface 125us of the gate capping layer 125 is exposed. When the CMP process is performed using the gate capping layer 125 and/or the first interlayer insulating layer 110 as a polishing stop layer, a slurry used in the CMP process may have greater selectivity with respect to an insulating material constituting the buried insulating layer 150 than with respect to insulating materials respectively constituting the gate capping layer 125 and the first interlayer insulating layer 110. As a result, a level LV4 of an upper surface 150us of the buried insulating layer 150 in the first and second device areas RX1 and RX2 may be different from a level LX3 of respective upper surfaces 125us and 110us of the gate capping layer 125 and the first interlayer insulating layer 110 in the field area FD. For example, the resultant structure after execution of the CMP process may have different heights between the first and second device areas RX1 and RX2 and the field area FD. For example, the level LV4 of the upper surface 150us of the buried insulating layer 150 in the first and second device areas RX1 and RX2 may be lower than the level LV3 of the upper surfaces 125us and 110us of the gate capping layer 125 and the first interlayer insulating layer 110, respectively, in the field area FD.

Figure 12A:
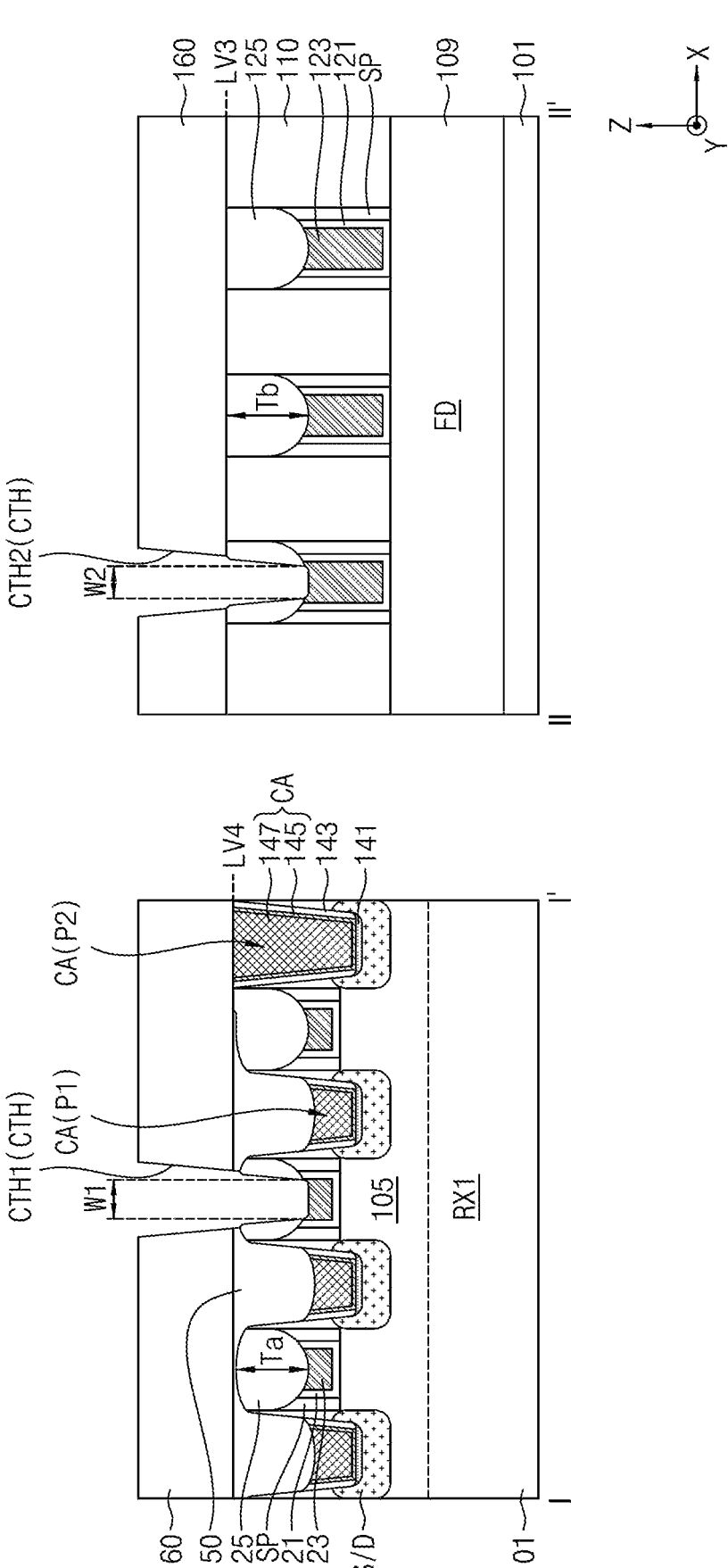
Figure 12B:
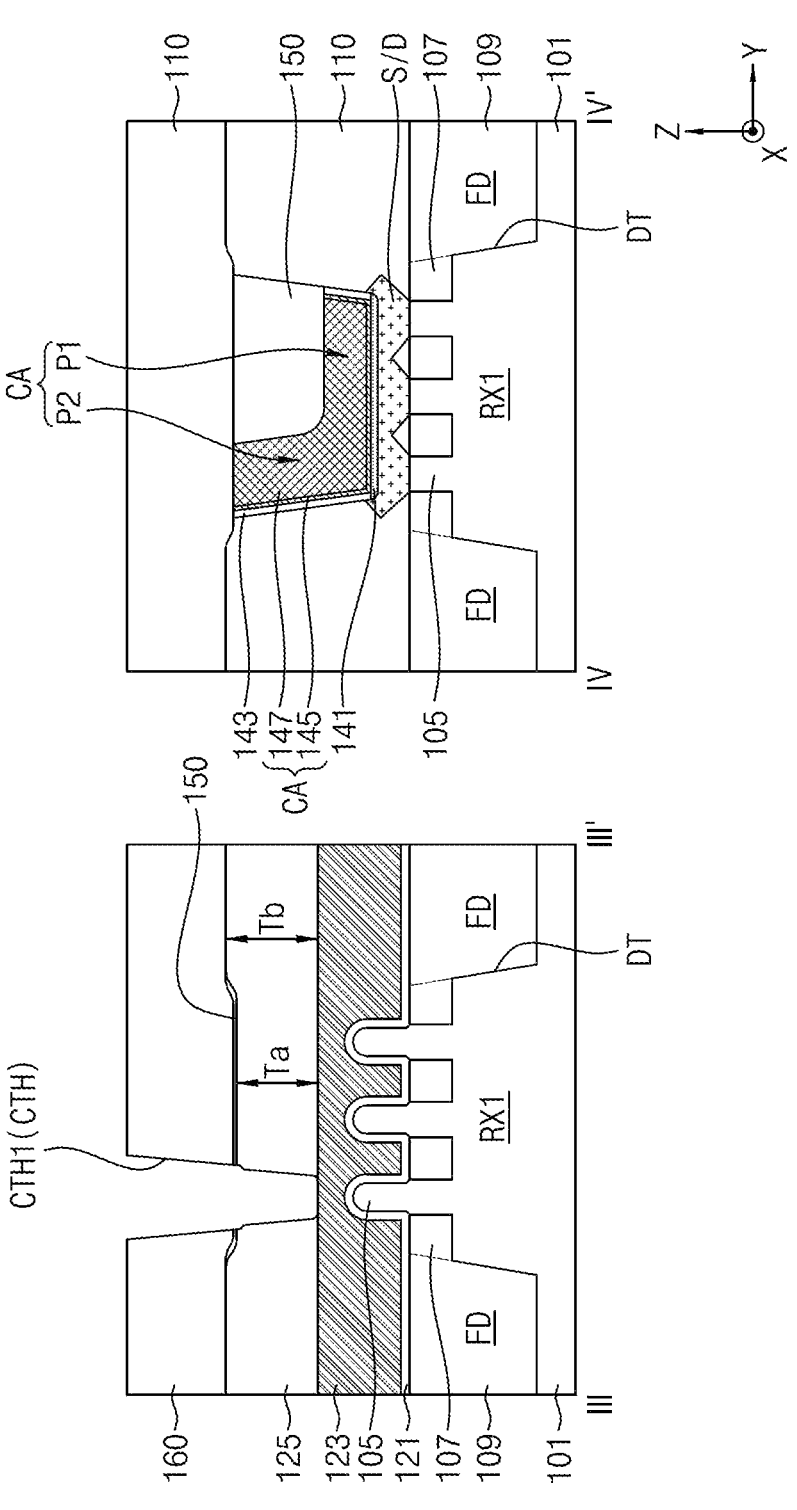

Referring to FIGS. 12A and 12B, a third upper insulating layer 160 may be formed on the resultant structure of FIGS. 11A and 11B. The third upper insulating layer 160 may cover the upper surface of the buried insulating layer 150. For example, the third upper insulating layer 160 may include oxide.

Thereafter, gate contact holes CTH exposing a part of gate electrodes 123 may be formed. The gate contact holes CTH may include a first gate contact hole CTH1 formed in the first and second device areas RX1 and RX2, and a second gate contact hole CTH2 formed in the field area FD. In the first and second device areas RX1 and RX2, the first gate contact hole CHT1 may be formed to expose the gate electrode 123 while extending through the third upper insulating layer 160, the buried insulating layer 150 and the gate capping layer 125. In the field area FD, the second gate contact hole CTH2 may be formed to expose the gate electrode 123 while extending through the third upper insulating layer 160 and the gate capping layer 125.

The first gate contact hole CTH1 and the second gate contact hole CTH2 may be formed by forming, on the third upper insulating layer 160, a mask pattern including a first opening and a second opening. The first opening of the mask pattern may expose a portion of an upper surface of the third upper insulating layer 160 that corresponds to a region in which the first gate contact hole CTH1 will be formed, and the second opening may expose an upper surface of the third upper insulating layer 160 that corresponds to a region in which the second gate contact hole CTH2 will be formed. In addition, the first gate contact hole CTH1 and the second gate contact hole CTH2 may be formed by then performing an anisotropic etching process using the mask pattern as an etch mask. The first gate contact hole CTH1 and the second gate contact hole CTH2 may be simultaneously formed through the anisotropic etching process. In an exemplary embodiment of the present inventive concept, the size of the first opening and the size of the second opening may be equal to each other; however, the present inventive concept is not limited thereto.

In an exemplary embodiment of the present inventive concept, a first minimum width W1 of the first gate contact hole CTH1 and a second minimum width W2 of the second gate contact hole CTH2 may be different from each other. For example, the first minimum width W1 may be greater than the second minimum width W2. A height Ta of the gate capping layer 125 etched when the first gate contact hole CTH1 is formed through the anisotropic etching process may be smaller than a height Tb of the gate capping layer 125 etched when the second gate contact hole CTH2 is formed through the anisotropic etching process. In addition, with reference to the upper surface of the substrate 101, a level LV4 of an uppermost end of the gate capping layer 125 etched when the first gate contact hole CTH1 is formed may be lower than a level LV3 of an uppermost end of the gate capping layer 125 etched when the second gate contact hole CTH2 is formed. Accordingly, the level, at which etching of the gate capping layer 125 begins for forming the first gate contact hole CTH1, may be different from the level, at which etching of the gate capping layer 125 begins for forming the second gate contact hole CTH2, and the etching height (or the etching amount) of the gate capping layer 125 when the first gate contact hole CTH1 is formed may be different from the etching height (or the etching amount) of the gate capping layer 125 when the second gate contact hole CTH2 is formed. As a result, the first gate contact hole CTH1 and the second gate contact hole CTH2 may be formed such that a first minimum width W1 at a lower end of the first gate contact hole CTH1 is different from a second minimum width W2 at a lower end of the second gate contact hole CTH2. In addition, the difference between the levels, at which etching of the gate capping layer 125 begins, and the difference between the etching heights of the gate capping layer 125 may influence formation of a final structure to be subsequently formed, that is, a first gate contact (cf. "CB1" in FIG. 14A) and a second gate contact (cf. "CB2" in FIG. 14A), such that the width of an upper end of the first gate contact and the width of an upper end of the second gate contact are different from each other.

Figure 13A:
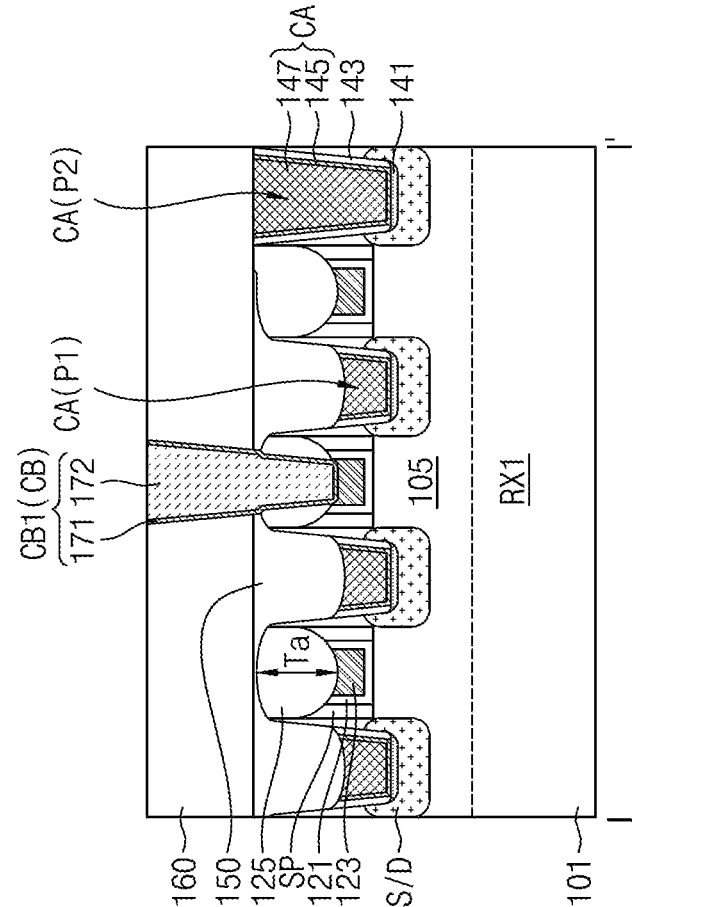
Figure 13B:
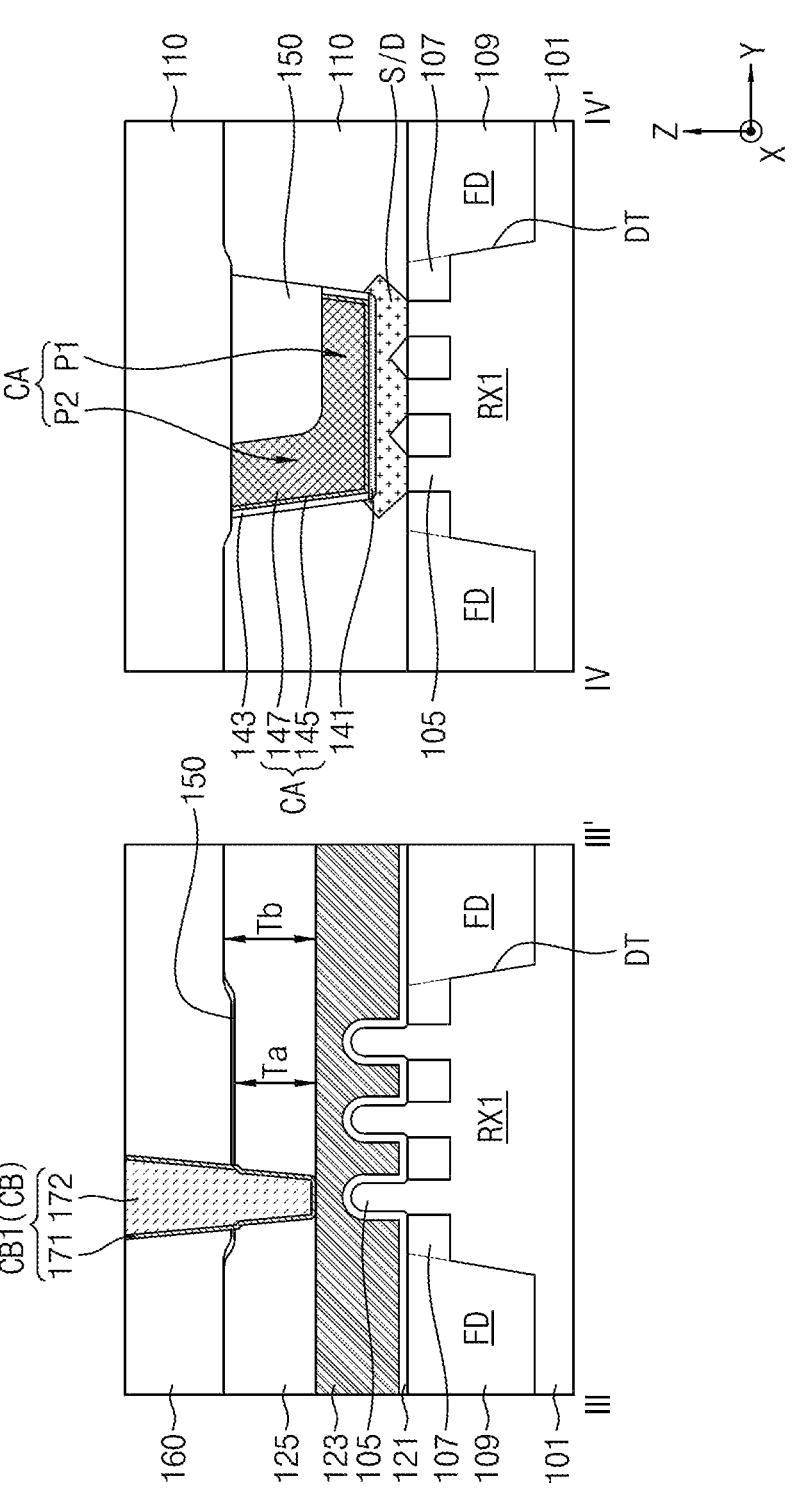

Referring to FIGS. 13A and 13B, gate contacts CB may be formed in the gate contact holes CTH. The gate contacts CB may include a barrier layer 171 and a plug layer 172. A first gate contact CB1 may be formed in the first gate contact hole CTH1, and a second gate contact CB2 may be formed in the second gate contact hole CTH2. The width of the first gate contact CB1 and the width of the second gate contact CB2 may be determined in accordance with the width of the first gate contact hole CTH1 and the width of the second gate contact hole CTH2, respectively.

Figure 14A:
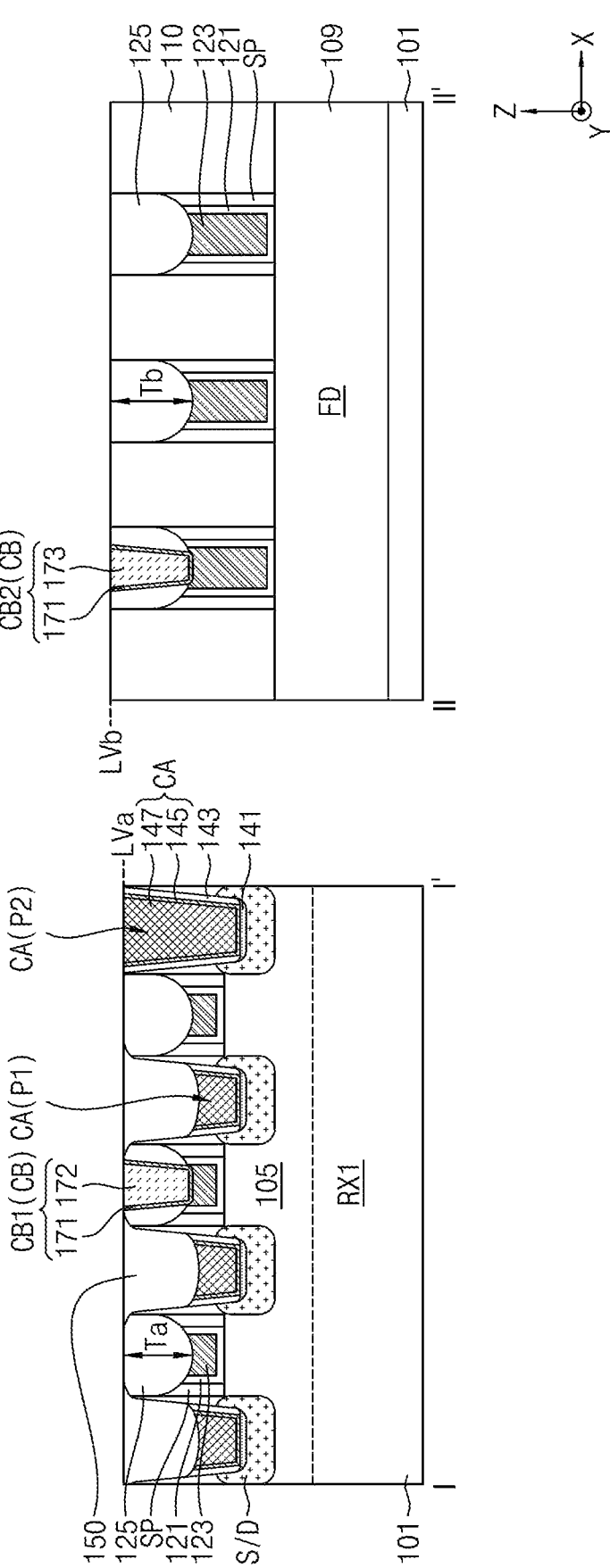
Figure 14B:
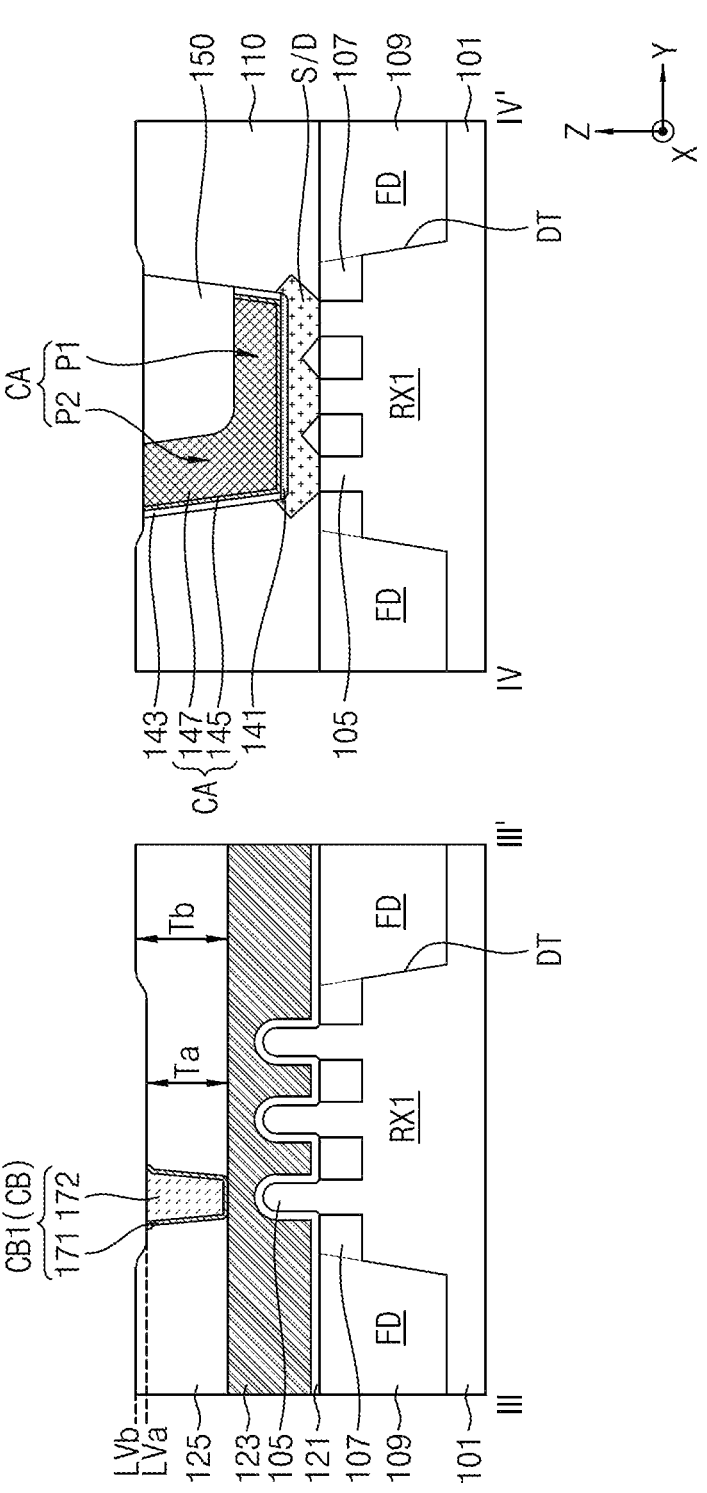

Referring to FIGS. 14A and 14B, an upper surface of the second portion P2 of the source/drain contact pattern CA may be exposed through a CMP process. Through the CMP process, the third upper insulating layer 160, a portion of the buried insulating layer 150, a portion of the first gate contact CB1, and a portion of the second gate contact CB2 may be removed, and a portion of the gate capping layer 125 and a portion of the first interlayer insulating layer 110 may also be removed by the CMP process. As the portion of the buried insulating layer 150 is removed, an upper surface of the gate capping layer 125 may be exposed in the first and second device areas RX1 and RX2. As the third upper insulating layer 160 is removed, an upper surface of the gate capping layer 125 and an upper surface of the first interlayer insulating layer 110 may be exposed in the field area FD. The resultant structure after execution of the CMP process may have different heights between the first and second device areas RX1 and RX2 and the field area FD and, as such, the gate capping layer 125 may have a height difference, and the first gate contact CB1 and the second gate contact CB2 may have a height difference. The reason why the resultant structure after execution of the CMP process has different heights between the first and second device areas RX1 and RX2 and the field area FD is that selectivity of the slurry used in the CMP process with respect to the insulating material constituting the buried insulating layer 150 and selectivity of the slurry with respect to the insulating material constituting the gate capping layer 125 and/or the first interlayer insulating layer 110 are different from each other. For example, the CMP process may use the gate capping layer 125 and/or the first interlayer insulting layer 110 as a polishing stop layer.

Figure 15A:
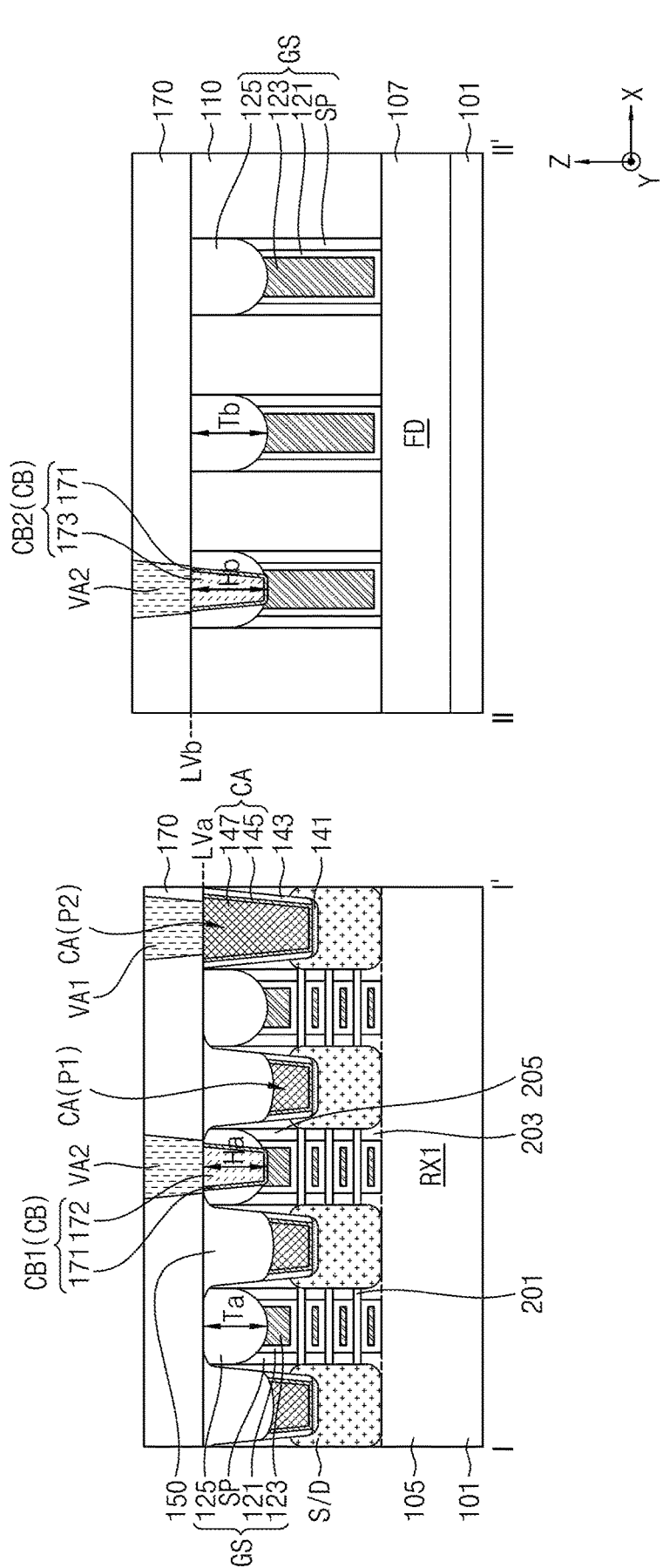
FIG. 15A illustrates cross-sectional views taken along lines I-I' and II-II' in FIG. 1 in accordance with an exemplary embodiment of the present inventive concept.
Figure 15B:
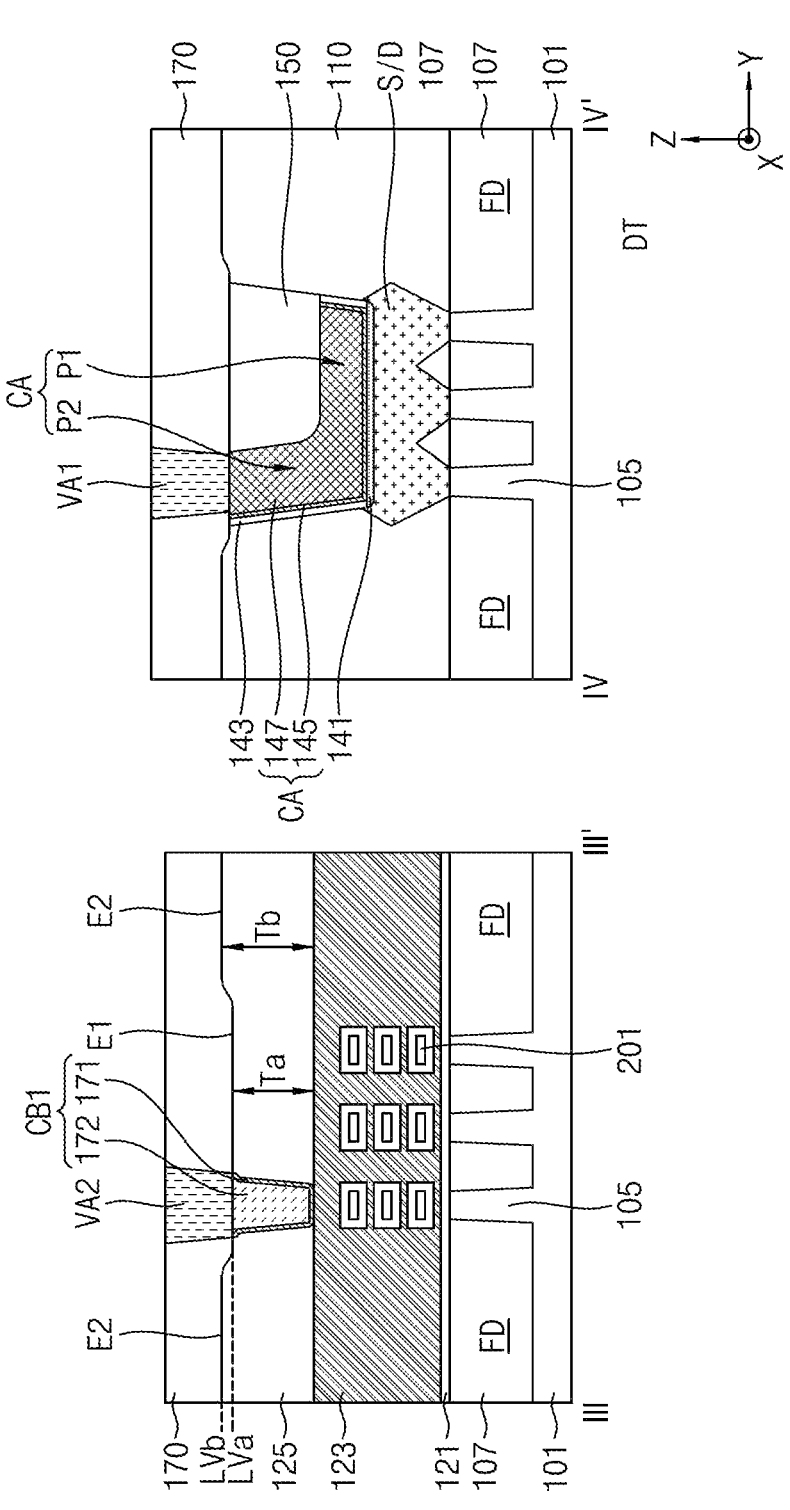
FIG. 15B illustrates cross-sectional views taken along lines III-III' and IV-IV' in FIG. 1 in accordance with an exemplary embodiment of the inventive concept.

FIG. 15A illustrate cross-sectional views taken along lines I-I' and II-II' in FIG. 1 in accordance with an exemplary embodiment of the present inventive concept. FIG. 15B illustrate cross-sectional views taken along lines III-III' and IV-IV" in FIG. 1 in accordance with an exemplary embodiment of the present inventive concept.

An integrated circuit device may include active regions 105 and 201, and the active regions 105 and 201 may include a fin-type active region 105 and a plurality of wire patterns 201. The fin-type active region 105 may protrude from a substrate 101 while extending in a first direction (e.g., the X direction), and the plurality of wire patterns 201 may be disposed to be spaced apart from the fin-type active region 105 in a third direction (e.g., the Z direction). The wire patterns 201 may be spaced apart from one another in the third direction (e.g., the Z direction). An element isolation layer 107 covering a side surface of the fin-type active region 105 may be formed at the substrate 101.

A gate structure GS may be disposed on the fin-type active region 105. The gate structure GS may include a gate insulating layer 121, a gate electrode 123, a gate spacer SP, and a gate capping layer 125. The gate insulating layer 121 may contact the wire pattern 201. The gate electrode 123 may at least partially surround the wire pattern 201, and the gate spacer SP may be disposed on opposite sidewalls of the gate electrode 123. The gate capping layer 125 may be disposed on the gate electrode 123.

The gate spacer SP may include inner spacers 203 and outer spacers 205. The inner spacers 203 may be disposed at a level lower than that of the wire pattern 201, which is disposed at an uppermost side from among the wire patterns 201, and the outer spacers 205 may be disposed at a level higher than that of the wire pattern 201 disposed at the uppermost side. The inner spacers 203 may contact a source/drain region S/D. In an exemplary embodiment of the present inventive concept, the inner spacer 203 may be omitted.

The integrated circuit device according to an exemplary embodiment of the present inventive concept may include a source/drain contact pattern CA, a buried insulating layer 150, a first gate contact CB1, a second gate contact CB2, a first interlayer insulating layer 110, a second interlayer insulating layer 170, a first via VA1, and a second via VA2, and configurations thereof may have characteristics identical or similar to the configurations described with reference to FIGS. 2A and 2B.

In accordance with the exemplary embodiments of the present inventive concept, a gate contact may be disposed not only in a field area, but also in a device area and, as such, it may be possible to secure an insulating distance between the gate contact and a source/drain contact pattern and to reduce resistance of the gate contact while reducing the entire area of the resultant integrated circuit device. Accordingly, reliability of the integrated circuit device may be increased.

While the present inventive concept has been described with reference to exemplary embodiments thereof, it will be understood by those of ordinary skill in the art that various changes in form and details may be made thereto without departing from the spirit and scope of the present inventive concept.

What is claimed is:

1. An integrated circuit device comprising:
   a substrate comprising a first device area, a second device area, and a field area including an element isolation layer and disposed between the first device area and the second device area;
   active regions extending in a first direction in the first device area;
   a first gate structure extending in a second direction intersecting the first direction in the first device area and the field area;
   a second gate structure spaced apart from the first gate structure in the first direction;
   a first gate contact disposed on the first gate structure in the first device area to vertically overlap one of the active regions in a direction perpendicular to the substrate; and
   a second gate contact disposed on the second gate structure in the field area to be spaced apart from regions that vertically overlap the active regions in the direction perpendicular to the substrate,
   wherein the first gate contact is disposed at a level equal to or lower than an upper end of the first gate structure,
   wherein the second gate contact is disposed at a level equal to or lower than an upper end of the second gate structure,
   wherein a first minimum width of the first gate contact and a second minimum width of the second gate contact are different from each other, wherein with respect to the substrate, a first height of the first gate contact is less than a second height of the second gate contact, wherein the first gate structure comprises a gate electrode and a gate capping layer disposed on the gate electrode, and wherein with respect to the substrate, a height of the gate capping layer in the first device area is smaller than a height of the gate capping layer in the field area.

2. The integrated circuit device according to claim 1, wherein the first minimum width of the first gate contact is greater than the second minimum width of the second gate contact.

3. The integrate circuit device according to claim 1, wherein the first minimum width of the first gate contact is smaller than the second minimum width of the second gate contact.

4. The integrate circuit device according to claim 1, wherein the first gate structure has a smaller height in the first device area than in the field area.

5. The integrated circuit device according to claim 1, wherein, with reference to an upper surface of the substrate, a level of an uppermost end of the gate capping layer in the first device area is lower than a level of an uppermost end of the gate capping layer in the field area.

6. The integrated circuit device according to claim 1, further comprising:

a source/drain region disposed on the active regions between the first gate structure and the second gate structure; and a source/drain contact disposed on the source/drain region, wherein the source/drain contact comprises a first portion and a second portion, wherein the first portion has a first height, and the second portion has a second height greater than the first height.

7. The integrated circuit device according to claim 6, wherein the second portion does not overlap with the first gate contact in the first direction.

8. The integrated circuit device according to claim 6, further comprising:

an interlayer insulating layer disposed on the first gate structure, the second gate structure and the source/drain region; and a buried insulating layer contacting the source/drain contact and the interlayer insulating layer.

9. An integrated circuit device comprising:

a substrate comprising a first device area, a second device area, and a field area including an element isolation layer and disposed between the first device area and the second device area;

active regions extending in a first direction in the first device area;

a first gate electrode extending in a second direction intersecting the first direction in the first device area and the field area;

a first gate capping layer disposed on the first gate electrode;

a second gate electrode spaced apart from the first gate electrode in the first direction;

a second gate capping layer disposed on the second gate electrode;

a first gate contact overlapping the first gate electrode in the first device area, extending through the first gate capping layer in the first device area, and vertically overlapping one of the active regions in a direction perpendicular to the substrate; and a second gate contact overlapping the second gate electrode in the field area, extending through the second gate capping layer in the field area, and being spaced apart from regions that vertically overlap the active regions in the direction perpendicular to the substrate, wherein a first minimum width of the first gate contact and a second minimum width of the second gate contact are different from each other, wherein with respect to the substrate, a first height of the first gate contact is less than a second height of the second gate contact, wherein with respect to the substrate, a height of the first gate capping layer in the first device area is smaller than a height of the second gate capping layer in the field area.

10. The integrated circuit device according to claim 9, wherein the first minimum width of the first gate contact is greater than the second minimum width of the second gate contact.

11. The integrate circuit device according to claim 9, wherein the first minimum width of the first gate contact is smaller than the second minimum width of the second gate contact.

12. The integrated circuit device according to claim 9, wherein the active regions comprise wire patterns respectively surrounded by the first gate electrode and the second gate electrode while being spaced apart from one another.

13. An integrated circuit device comprising:

a substrate comprising a first device area, a second device area, and a field area including an element isolation layer and disposed between the first device area and the second device area;

active regions extending in a first direction in the first device area;

a first gate electrode extending in a second direction intersecting the first direction in the first device area and the field area;

a first gate capping layer disposed on the first gate electrode;

a second gate electrode spaced apart from the first gate electrode in the first direction;

a second gate capping layer disposed on the second gate electrode;

a first gate contact connected to the first gate electrode, penetrating the first gate capping layer in the first device area, and vertically overlapping one of the active regions in a direction perpendicular to the substrate;

a second gate contact connected to the second gate electrode, penetrating the second gate capping layer in the field area, and being spaced apart from regions that vertically overlap the active regions in the direction perpendicular to the substrate;

a source/drain region disposed on the active regions; and a source/drain contact disposed on the source/drain region, wherein a first minimum width of the first gate contact is greater than a second minimum width of the second gate contact, wherein with respect to the substrate, a first height of the first gate contact is less than a second height of the second gate contact, and wherein with respect to the substrate, a height of the first gate capping layer in the first device area is smaller than a height of the second gate capping layer in the field area.

14. The integrated circuit device according to claim 13, wherein:

the source/drain contact comprises a first portion and a second portion, wherein the first portion has a first height, and the second portion has a second height greater than the first height.

\* \* \* \* \*